US012442455B2

(12) United States Patent
Ogawa et al.

(10) Patent No.: US 12,442,455 B2
(45) Date of Patent: Oct. 14, 2025

(54) GAS SUPPLY APPARATUS, VACUUM PROCESSING APPARATUS, AND GAS SUPPLY METHOD

(71) Applicant: Hitachi High-Tech Corporation, Tokyo (JP)

(72) Inventors: Yoshifumi Ogawa, Tokyo (JP); Yutaka Kouzuma, Tokyo (JP); Keisuke Akinaga, Tokyo (JP); Kazuyuki Hirozane, Tokyo (JP); Yasushi Sonoda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/762,821

(22) PCT Filed: Feb. 8, 2021

(86) PCT No.: PCT/JP2021/004546
§ 371 (c)(1),
(2) Date: Mar. 23, 2022

(87) PCT Pub. No.: WO2022/168301
PCT Pub. Date: Aug. 11, 2022

(65) Prior Publication Data
US 2024/0055278 A1     Feb. 15, 2024

(51) Int. Cl.
*F16K 11/22*     (2006.01)
*F16K 7/02*     (2006.01)
(Continued)

(52) U.S. Cl.
CPC ............. *F16K 11/22* (2013.01); *F16K 7/02* (2013.01); *F16K 11/105* (2013.01);
(Continued)

(58) Field of Classification Search
None
See application file for complete search history.

(56) References Cited

U.S. PATENT DOCUMENTS 5,605,179 A    2/1997   Strong, Jr. et al.
9,297,374 B2*   3/2016   Braggin ................ F04B 49/065
(Continued)

FOREIGN PATENT DOCUMENTS

JP    H03115663 U    11/1991
JP    H06077234 U    10/1994
(Continued)

OTHER PUBLICATIONS

Search Report mailed Apr. 6, 2021 in International Application No. PCT/JP2021/004546.
(Continued)

*Primary Examiner* — Umashankar Venkatesan
(74) *Attorney, Agent, or Firm* — Miles & Stockbridge, P.C.

(57) ABSTRACT

There is provided a gas supply apparatus that can effectively suppress a trouble caused by backflow of a process gas to the upstream side when processing is performed by using the process gas inside a chamber. The gas supply apparatus supplies gas to a processing chamber in which a sample is processed. The gas supply apparatus includes: ports respectively connected to gas sources of a plurality of types of gases containing a purging gas and a processing gas; and a collective pipe in which the plurality of types of gases supplied from the ports are joined and flowed. A gas flow path through which gas supplied from the port connected to the gas source for the purging gas flows is formed on an uppermost stream side of the collective pipe.

8 Claims, 13 Drawing Sheets

(51) Int. Cl.
  *F16K 11/10*   (2006.01)
  *F16K 31/126*  (2006.01)
  *H01L 21/67*   (2006.01)

(52) U.S. Cl.
  CPC ...... *F16K 31/126* (2013.01); *H01L 21/67069* (2013.01); *H01L 21/67253* (2013.01)

(56) References Cited

U.S. PATENT DOCUMENTS

| | | | |
|---|---|---|---|
| 9,653,357 B2* | 5/2017 | Arami | H01L 21/3065 |
| 9,841,770 B2* | 12/2017 | Hirata | F16K 31/06 |
| 2003/0021207 A1 | 1/2003 | Ono | |
| 2003/0192608 A1 | 10/2003 | Otsuki et al. | |
| 2005/0087299 A1* | 4/2005 | Okabe | H01L 21/3185 |
| | | | 257/E21.293 |
| 2006/0076060 A1 | 4/2006 | Ohmi et al. | |
| 2006/0096533 A1 | 5/2006 | Mochizuki et al. | |
| 2009/0170332 A1 | 7/2009 | Komiyama et al. | |
| 2009/0232985 A1 | 9/2009 | Dussarrat et al. | |
| 2010/0145633 A1 | 6/2010 | Yasuda | |
| 2011/0121217 A1 | 5/2011 | Ohmi et al. | |
| 2012/0222751 A1 | 9/2012 | Okabe | |
| 2014/0137961 A1* | 5/2014 | Kao | H01L 21/67017 |
| | | | 137/561 R |
| 2014/0299201 A1 | 10/2014 | Hirose et al. | |
| 2016/0379857 A1 | 12/2016 | Ogawa et al. | |
| 2019/0080888 A1 | 3/2019 | Ikenaga et al. | |
| 2020/0006079 A1 | 1/2020 | Miyoshi et al. | |
| 2024/0111313 A1 | 4/2024 | Ogawa et al. | |

FOREIGN PATENT DOCUMENTS

| | | | |
|---|---|---|---|
| JP | 2001129386 A | 5/2001 | |
| JP | 2002222770 A | 8/2002 | |
| JP | 2004183743 A | 7/2004 | |
| JP | 2004-264881 A | 9/2004 | |
| JP | 2008069918 A | 3/2008 | |
| JP | 2008159905 A | 7/2008 | |
| JP | 2008533731 A | 8/2008 | |
| WO | 2006097525 A2 | 9/2006 | |
| WO | 2008069227 A1 | 6/2008 | |
| WO | 2009122683 A1 | 10/2009 | |
| WO | 2013046660 A1 | 4/2013 | |
| WO | 2016121075 A1 | 8/2016 | |

OTHER PUBLICATIONS

Written Opinion mailed Apr. 6, 2021 in International Application No. PCT/JP2021/004546.
Search Report mailed May 25, 2021 in International Application No. PCT/JP2021/013349.
Written Opinion mailed May 25, 2021 in International Application No. PCT/JP2021/013349.
Office Action mailed Apr. 10, 2025 in U.S. Appl. No. 17/642,324.

* cited by examiner

GAS SUPPLY APPARATUS, VACUUM PROCESSING APPARATUS, AND GAS SUPPLY METHOD

TECHNICAL FIELD

The present invention relates to a gas supply apparatus, a vacuum processing apparatus, and a gas supply method.

BACKGROUND ART

Semiconductor manufacturing apparatuses are important industrial machines that are indispensable in the world now because the apparatuses process work materials such as wafers by using high-purity process gas having various gas properties in manufacturing an electrical component such as a semiconductor device, a liquid crystal device, a solar cell, and a MEMS measuring instrument.

In these semiconductor manufacturing apparatuses, the supply of process gas is controlled in accordance with processing information of each step of the set process recipe. For example, a gas flow rate is controlled by using a thermal sensor type mass flow rate controller (hereinafter, called MFC), a pressure flow rate controller (hereinafter, called PFC), or the like.

Normally, the supply/stop of process gas is controlled by the control of the opening and closing of a gas valve arranged at the front and rear of these flow rate controllers. Through such the control, a single process gas or mixed gas whose mixing ratio of a plurality of types of process gases is controlled with a gas flow rate is introduced into a processing chamber or a reaction reactor (chamber) in which a workpiece is stored. Herein, the gas may be further mixed with another process gas.

The gas introduced into these chambers is turned into plasma, is activated at high temperature, or is ionized and accelerated inside an electric field to cause a surface reaction with respect to a work material. Herein, the surface reaction means a phenomenon such as etching of various materials, ashing (ash making) of mask materials containing surface organic matter that is no longer needed, dry removal of surface material of a workpiece by sputter etching, etc. using physical ions, film formation on a surface of a workpiece through the formation of deposits by sputtering a target material or by reacting a material by a chemical vapor deposition (CVD) method, surface modification (hydrophobicity, hydrophilicity, etc.) of a workpiece, driving of specific elements or molecules from the surface to the inside of a workpiece, and thermal diffusion. Process gases are used for various surface treatments depending on the type of gas used and the method of activation.

The supply of process gas is normally controlled as described below. The open/close control of a normally closed air-operated valve is normally used to supply or stop this process gas to the chamber for example.

In a step of supplying this process gas, pressurized air from an air source is supplied to the air-operated valve provided in a supply pipe for the process gas by supplying electrical power to a solenoid valve assigned to the process gas and opening the solenoid valve. Furthermore, the air-operated valve is opened, and this process gas is supplied to a chamber. In a step of stopping the supply of this process gas, because the solenoid valve is controlled off to stop the supply of the pressurized air and the residual air is discharged to close the air-operated valve for this process gas, this gas is not supplied.

When the occurrence of troubles such as a pressure adjustment error and a decrease in gas flow rate that cannot be tolerated in the recipe control is detected, the process of the step in the recipe is suspended. In response to such the detection, it is possible to control the solenoid valve off, cut off the supply of the pressurized air to the air-operated valve, close the air-operated valve, and stop the injection of this process gas.

By the process of this step, only the air-operated valve for dangerous process gas and highly reactive process gas is closed. On the other hand, inactive and relatively safe gas used for purging and dilution such as argon gas (hereinafter, Ar) and nitrogen gas (hereinafter, $N_2$) may continue to flow in order to avoid attaching foreign matter (particle) to a workpiece even if a trouble is detected.

Furthermore, because all solenoid valves are closed at once to cut off the supply of the pressurized air when a power supply error, power outage, etc. occur, the semiconductor manufacturing apparatus can be safely controlled by closing all the air-operated valves to stop the supply of all process gases to the chamber.

For the flow control of process gas, the MFC is a system that monitors heat transmitted by gas molecules by using a thermal sensor and controls an opening degree of an orifice in accordance with the heat to obtain a desired gas flow rate. On the contrary, the PFC that is often used recently is a system that performs sound velocity control (control the upstream pressure of the orifice to be approximately more twice than the downstream pressure of the orifice so that a gas velocity reaches a sound velocity) on gas that normally flows in the orifice so as to obtain a predetermined flow rate by using a condition (critical expansion condition) that a flow rate and a pressure in an upstream of the orifice are proportional.

Actually, the PFC opens and closes a valve configured to send gas onto the upstream side and controls the upstream-side pressure of the orifice to obtain a desired gas flow rate. The PFC may employ a system that provides therein a resistor to flow gas instead of the orifice to control a flow rate based on a pressure which considers the characteristics of each gas.

In the control system that employs the MFC and PFC systems, air-operated valves are respectively arranged after or before controlling respective process gas flow rates, and the controlled process gases are introduced into the chamber.

Meanwhile, with the progress of microfabrication in semiconductor device manufacturing, the evolution of process gas control is required for higher-accuracy processing. Specifically, the occurrence of metallic contamination (metal contamination) or foreign matter (particle) is further suppressed to a low level, and processing dimensional accuracy, processing film thickness control, and etching are required to process target material with a high selection ratio (do not shave and remove anything other than the target material as much as possible).

To meet these requirements, there are taken measures such as controlling and processing complex reactions by using gas having higher reactivity that was not previously used, conversely diluting process gas with inert gas such as Ar, He, and $N_2$ with higher accuracy to suppress a processing speed, further cyclically switching between the types of gas to progress a reaction step by step, and more strictly performing the purging of corrosive gas after use. For this reason, a structure of a valve unit for gas supply that can suppress the attachment of contamination or foreign matter and its control have become necessary.

Such the problems will be specifically described. In the recent apparatus, a case where a combustible (inflammable) gas, an oxidizing gas or a spontaneous combustion (pyrophoric) gas are mixed and are used inside the same chamber is increased, and thus it is becoming difficult to obtain the desired processing performance unless control is performed by a more complex reaction system. When such the gas is used, even if energy to propel a reaction is not especially provided, a solid substance may be formed simply by mixing two types of gases inside the gas pipe. In this case, by flowing the formed solid substance backward, troubles such as breaking down a flow rate controller, causing the gas pipe to be blocked, and attaching the substance to a workpiece as foreign matter (particle) are more likely to occur.

From the viewpoint of ensuring security against such the troubles and avoiding the troubles, it is necessary to group a combustible gas, an oxidizing gas, a spontaneous combustion gas, and a gas that cannot be mixed in two types according to their characteristics and to introduce the gases into the chamber through different process gas pipes. Because the chamber is warmed, it is considered that the attachment of a solid substance is suppressed on the inner wall of the chamber to keep it clean. Moreover, the gas introduced into the chamber is managed by maintaining and monitoring a vacuum pressure so as not to exceed the atmospheric pressure even after a reaction when explosive combustion is caused by the reaction for example, that is, so as not to break down the chamber. During the loading and unloading of the workpiece and in the pretreatment of pressure adjustment for processing and the post-treatment of discharging the residual gas, the attachment of foreign matter is suppressed by placing the surface of the workpiece under laminar gas flow.

A problem when this process gas is flowed to perform gas treatment will be described. When performing the gas treatment, there is a case where a single process gas (100%) is flowed, a case where the process gas is diluted with another gas (Ar etc.) (a proportion of this process gas is less than 100%) and is flowed, or a case where these gases are mixed with another process gas and are flowed.

Furthermore, there may be a series of steps of flowing this process gas for a predetermined time, flowing the process gas of inert gas for purging after that, flowing another process gas by using another gas supply line during the purging, and then flowing purge gas in the other process gas line. It is also necessary to consider the processing method, called atomic layer deposition (ALD) or atomic layer etching (ALE), of cyclically repeating multiple times a gas flow that accompanies the time change of the types of gases to be supplied to the chamber, considering the gas flow as one cycle.

During the process according to the recipe, besides these main processes of mixing and diluting a plurality of types of gases to flow or cyclically switching between the gases to flow, there is also a post-treatment step such as purging gas during the transportation of a workpiece, adjusting pressure inside a chamber prior to plasma and heating, performing a pretreatment for removing moisture on the surface of the workpiece, and discharging residual gas remaining in the chamber before taking out the workpiece.

In an unused step where the gas does not need to be introduced into the chamber, an air-operated valve downstream of the flow rate controller for this process gas described above or both the upstream and downstream air-operated valves is/are closed without normally controlling the gas flow rate. The air-operated valves are not directly attached to the wall of the chamber, but, in many apparatuses, are installed together with the flow rate controller in a gas unit (gas box) that is installed separately from the chamber.

CITATION LIST

Patent Documents

Patent Document 1: Japanese Patent Application Laid-Open No. 2008-533731
Patent Document 2: Japanese Patent Application Laid-Open No. 2004-183743
Patent Document 3: WO2009/122683
Patent Document 4: WO2013/046660

SUMMARY OF THE INVENTION

Problem to be Solved by the Invention

Patent Document 1 discloses a schematic configuration of a supply line for process gas. This configuration includes lines (for gas disposal) that bypass the chamber and cause an oxidizing gas system and a gas system containing a Si group to individually flow into an exhaust system, the chamber has a structure that can constantly continue to flow gas, and gas to be supplied to a wafer inside the chamber that is a workpiece can be switched cyclically in a pulsed manner by switching of the valves. Moreover, the control method is also disclosed in Patent Document 1.

However, the gas flows in a gas pipe for a gas disposal line when the gas is discarded, but the gas does not flow when the gas is caused to flow to the chamber side. For that reason, there is a problem that the gas of the exhaust system is back-diffused into a pipe that connects the valve and the exhaust pipe at the disposal destination even if the valve for the gas disposal line is closed.

Unreacted process gas, an active species (radical, etc.), and a reaction product are contained in this back-diffusing gas, and they are attached to the inside of the pipe, are reacted, and are accumulated. In an apparatus that actually has the same configuration as this, it was confirmed that there is a problem that foreign matter is attached to the seat surface of the air-operated valve provided for waste gas to diffuse particles into the supply line pipe to the chamber by the opening/closing operations and a trouble is caused to place particles on the wafer to decrease a good product processing ratio (processing yield) of the workpiece.

According to Patent Document 1, it is obvious that, because the plurality of process gases are mixed and flowed upstream of a gas valve in the final stage of the chamber supply before entering the chamber or are alternately flowed by using a common gas pipe, the above-described combination of the types of gases that cannot be mixed and flowed cannot be used.

For the gas that cannot be mixed and flowed, it is a good idea to provide another supply system together with the gas supply system of Patent Document 1 and to provide supply lines to the chamber independently. However, even if the two supply lines are provided in the chamber and valves in the final stage of the chamber supply in Patent Document 1 are installed in the respective supply lines, the back diffusion of another process gas cannot be suppressed strictly.

The reason is that, in an apparatus that processes a workpiece by using these process gases, a member called a spare space (front chamber), a baffle plate, or a gas shower plate is provided upstream of the flow of gas in contact with the chamber space and a gas route through which this process gas singly flows is located downstream from the air-operated valve in the final stage described above, to produce appropriate gas flow and gas mixture with respect to the workpiece.

When highly corrosive gas of other process gases is back-diffused toward such the member, there is a problem that the corrosive gas reacts with moisture in the air when open to the atmosphere to corrode the spare space (front chamber), the baffle plate, or the shower plate that should not normally come into contact with the corrosive gas and thus metallic contamination (metal contamination) is caused or the number of parts to be replaced during maintenance is increased.

Moreover, purging to efficiently expel the process gas accumulated in the pipe after the process in a short time may become important. Moreover, when a process of cyclically switching between gases in a short time is performed, switching of the process gases needs to be performed quickly.

For example, Patent Document 2 discloses a method of providing a collective pipe communicating with an integrated valve to arrange valves whose pipe lengths on the anti-diaphragm side become small as much as possible. Although this method is a special case where components of the valves are directly incorporated into an integrated valve block and cannot be replaced independently, it has been devised to reduce a dead volume. The importance of reducing a dead volume to increase gas replaceability is disclosed. However, a gas line connected to this block still has a dead volume in fact so as not to be zero.

Moreover, Patent Document 3 discloses a structure of a special three-way valve. This special three-way valve is an example applied to a solenoid valve, but the structure of a gas contact portion does not change particularly when applied to an air-operated valve. It is said that this structure can realize dead space-free (gas) flow, but the layout of gas valves and how to control flow rates when mixing process gases have not been clarified.

Moreover, Patent Document 4 discloses the structure of an integrated valve that supplies a plurality of gases by using a pressure type flow rate controller. Although the integrated valve is provided with instruments arranged on both the front and back sides and is also provided with a common line for purging, the gas switching has a dead volume in spite of the use of an air-operated special three-way valve.

Normally, a pressure adjustment valve for processing pressure adjustment is provided at a gas discharge port (exhaust port) from the chamber where the gas treatment is performed. Therefore, the downstream side of the pressure adjustment valve naturally has a pressure lower than the pressure of the chamber. When the gas is discharged downstream of the pressure control valve for the purpose of outgassing without changing a gas supply amount to the chamber, a downstream-side pressure is raised and the pressure of the chamber is also raised. For this reason, waste gas flows backward into the chamber or a discharge rate of gas decreases and thus it might affect the gas treatment performed inside the chamber.

Among manufacturing apparatuses, there is one in which a mechanical booster pump or a turbo molecular pump is arranged at the discharge port of the gas from the chamber to increase exhaust performance. Such the manufacturing apparatus can vanishingly reduce the influence on the backflow to the chamber and the decrease in exhaust speed at the timing of waste gas described above. However, when the gas flow rate adjustment of the MFC and PFC and the opening operation of the air-operated valve described above are simultaneously started, it takes a fixed time (normally several seconds) until the flow rate is stabilized. It further takes a time until the pressure of the chamber is stabilized under the influence.

As described here, it is a problem to increase gas controllability, that is, time controllability of the content/exclusion of this process gas at the time of the supply/stop without providing a dead volume in a process gas line and to provide clean gas line and gas supply system.

An object of the present invention is to provide a gas supply apparatus, a vacuum processing apparatus, and a gas supply method, which can effectively suppress a trouble caused by backflow of process gas to the upstream side when processing is performed by using the process gas inside the chamber.

Means for Solving the Problems

To solve the above problems, one of representative gas supply apparatuses according to the present invention is a gas supply apparatus that supplies gas to a processing chamber in which a sample is processed. The gas supply apparatus includes: ports respectively connected to gas sources of a plurality of types of gases containing a purging gas and a processing gas; and a collective pipe in which the plurality of types of gases supplied from the ports are joined and flowed. A gas flow path through which gas supplied from the port connected to the gas source for the purging gas flows is formed on an uppermost stream side of the collective pipe.

Advantageous Effect of the Invention

According to the present invention, a gas supply apparatus, a vacuum processing apparatus, and a gas supply method can be provided which can effectively suppress a trouble caused by backflow of process gas to the upstream side when processing is performed by using the process gas inside the chamber.

Problems, configurations, and effects other than those described above will be clarified by the description of the following embodiments.

DESCRIPTION OF EMBODIMENT(S)

Figure 1:
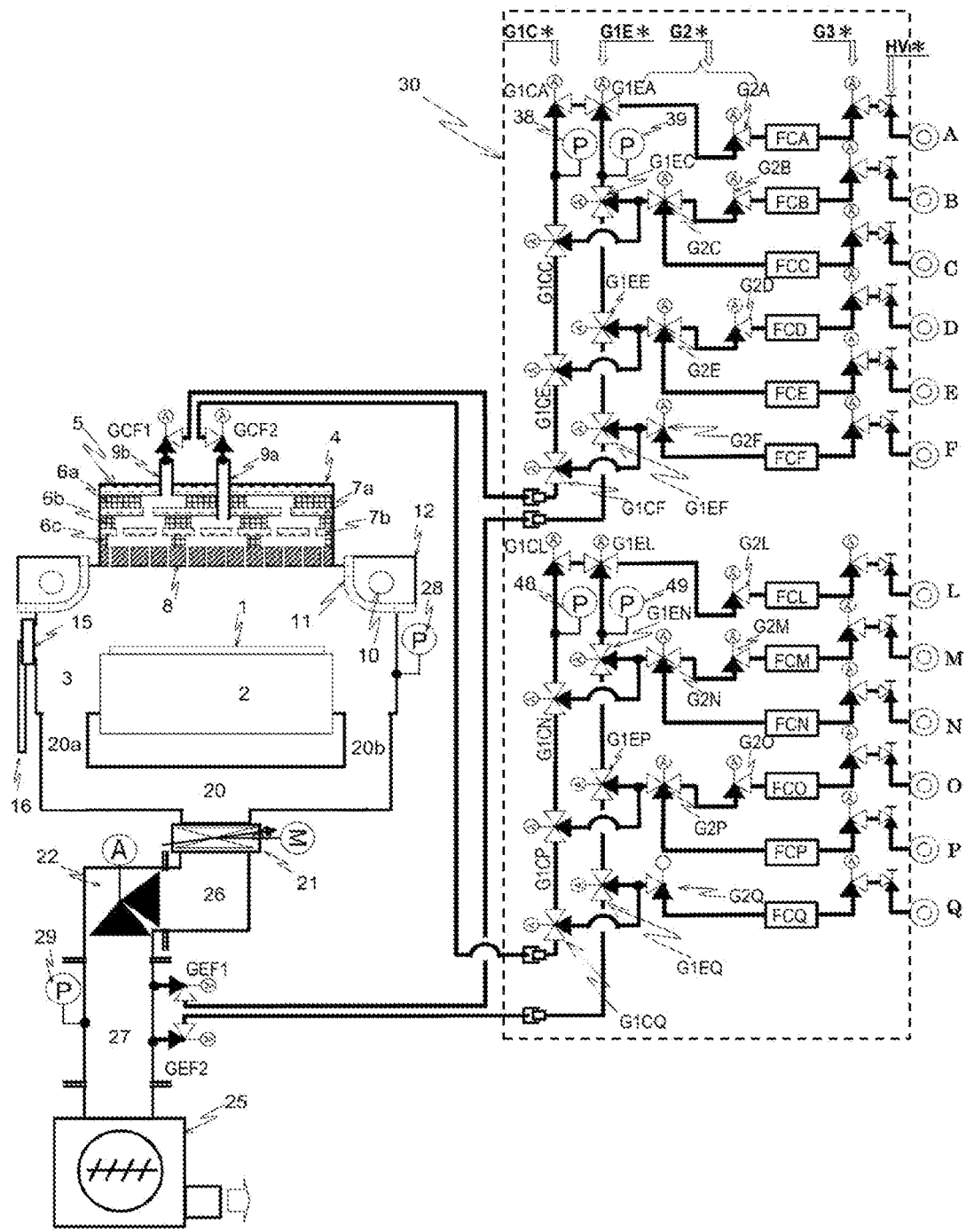
FIG. 1 is a schematic diagram illustrating a gas supply apparatus and a vacuum processing apparatus according to an embodiment of the present invention.

In the present embodiment, to overcome the problem of the conventional technology, gas pipes are blocked according to the properties of process gas, and purge gas is used as a set for each group. A gas flow rate control unit for dilution is provided only for dilution separately from a gas flow rate control unit for purging. Of course, when a single process gas is constantly used without diluting the process gas, the dilution-side flow rate control unit is not required.

The gas for purging uses Ar or other rare (noble) gases, and an inert gas inside a pipe such as nitrogen depending on the desired gas treatment. These gas flow rate controllers for purging are installed on the uppermost stream side of a collective pipe in which gases flow in common. Moreover, a joining part in which process gases that cyclically flow in accordance with a process join, is provided downstream of the collective pipe. When cyclically flowing the gases, a purge gas (also called purging gas) and a process gas (also called processing gas) are caused not to flow simultaneously and only the role for pipe purging is given to the purge gas.

The problem of back diffusion and decrease in exhaust speed when cyclically switching between gases and further the problem of taking time to stabilize a gas flow rate are solved by respectively providing, in group units of the gases, a supply line (also called supply pipe or first gas line) to a chamber and a waste gas line (also called exhaust system or second gas line) to a common exhaust system. By doing so, it is possible to constantly flow the process gas into either line during a processing time of a workpiece and flow the purge gas into a line different from the line. It is preferable that two air-operated valves are provided downstream of the MFC and PFC configured to control a flow rate of process gas and downstream of the MFC and PFC configured to control a flow rate of purging gas, and one of them is connected to a chamber supply line and the other is connected to a waste gas line for an exhaust system.

In a state where both the process gas and the purge gas are stably controlled by gas flow rate controllers, keeping their gas flow rates constant, it is possible to switch between a gas supply destination (inside chamber) and a gas disposal destination (outside chamber) by merely switching between the air-operated valves within a short time (sub-second). Furthermore, even if switching between gases is performed, it is possible to suppress pressure fluctuation on the chamber side within an extremely short time of a valve switching time to obtain a target pressure for the gas treatment if each flow rate is appropriately adjusted.

When cyclically switching between gases in accordance with the gas treatment and flowing the gases, the gases are constantly filled in all the supply lines to the chamber and all the waste gas lines to the exhaust system and they are managed to a positive pressure than an outflow destination, and thus back diffusion does not occur.

Next, with the configuration of the gas supply apparatus, a configuration of valves that can suppress a dead volume is considered. When alternately switching between the process gas and the purge gas and flowing the gases, it is determined whether a gas flow without a dead volume should be truly established, how a timing should be taken, or the like.

It is important to remove a dead volume with respect to the process gas or the process gas that is already mixed with dilution gas. Therefore, it is important to immediately cut off the supply of process gas. The purge gas normally employs argon and other rare gases or gas such as nitrogen that has low reactivity and low contribution to a surface reaction. Even if the purge gas flows out after stopping, the influence on a surface reaction is small because reactivity is weak originally. Therefore, it is more important to consider a configuration that a dead volume is eliminated for process gas (or diluted process gas).

The purge gas to be supplied from the uppermost stream side of the collective pipe flows from the diaphragm side to the anti-diaphragm side of the central hole by a special three-way valve to be described later in detail. The process gas (or diluted process gas), vice versa, flows out from the anti-diaphragm side of the central hole to the diaphragm side by the special three-way valve. In this way, the purge gas that is flowed out from the uppermost stream side when switching to the purge gas can wash the process gas away downstream without a dead volume. In other words, the special three-way valve is configured to form the collective pipe itself in the diaphragm-side gas flow path through which gas can pass without cutting off the gas flow and to join process gas flowing out by the opening operation of a diaphragm of the special three-way valve into the collective pipe.

With this configuration, the gas supply apparatus can be constructed which can purge gas while suppressing a dead volume with respect to the process gas (or diluted process gas). An uppermost stream gas valve that flows out the purge gas is arranged in a direction flowing out the flow-controlled purge gas from the diaphragm side to the anti-diaphragm side by the opening operation of the diaphragm, and a gas contact portion when the process gas flows out to the collective pipe is limited to a central pressing part of the diaphragm and the uppermost stream end of the collective pipe does not have a dead volume.

Moreover, the gas supply apparatus separately includes a three-way valve configured to perform the opening and closing operation by using a diaphragm, a flow rate controller for a processing gas, and a flow rate controller for a dilution gas diluting the processing gas. To control the flow rate of the processing gas, it is desirable that a gas flow path through which the dilution gas can pass without cutting off the gas flow is formed on the diaphragm side of the three-way valve and the processing gas is flowed out by the opening operation of the diaphragm of the three-way valve to be joined into the gas flow path through which dilution gas can pass. At this time, a gas valve downstream of the flow rate controller flowing out the diluting gas (also called dilution gas) is arranged in a direction flowing out the flow-controlled dilution gas from the diaphragm side to the anti-diaphragm side, and a gas contact portion of the process gas joined into the gas flow path is limited to a central pressing part of the diaphragm and the uppermost stream end of the gas flow path does not have a dead volume. Herein, the gas contact portion is a portion where a reaction gas diffuses and is in contact with the surface.

Furthermore, when gas is intermittently (cyclically) supplied to a processing chamber in a gas supply block, valves arranged in the collective pipe connected to a supply pipe leading to the processing chamber or valves arranged in the collective pipe connected to an exhaust system for waste gas are alternately opened and closed, while constantly performing the gas flow control by the flow rate controllers of the purge gas and the type of gas to be used, to perform the intermittent supply of the gases to the processing chamber and to flow the purge gas to the supply line side different from the supply line of the gas from the valve for purge gas arranged on the uppermost stream side of the collective pipe, and thus the gases can be constantly flowed in both the collective pipes and both the supply pipes.

Particularly, when there are two or more gas supply blocks that intermittently supply processing gases, the simultaneous opening and closing of the processing gas supply valves forming the collective pipe may be prohibited by, for example, an interlock etc. so that the processing gases respectively supplied from the gas supply blocks are not simultaneously supplied to the processing chamber or the exhaust system.

Moreover, the processing gas can be caused to flow out in the middle of the collective pipe while supplying the purging gas from the uppermost stream side of the collective pipe. After processing a sample, a step of stopping supplying the processing gas and simultaneously flowing the purging gas to the supply line and the exhaust line may be performed.

A configuration of a diluting part of process gas will be described below. A two-way valve for dilution gas introduces a dilution gas onto the diaphragm side, and flows out it to the anti-diaphragm side of the central hole. A special three-way valve for process gas downstream of it causes the flowed-out dilution gas to communicate on the diaphragm side and flow, and causes the process gas to flow out to the diaphragm side through which the dilution gas flows from the anti-diaphragm side of the central hole. Although this configuration is similar to the configuration for purge gas, but a valve for process gas and a valve for dilution gas are controlled to be able to be simultaneously opened. By rather opening the valve for dilution gas first and then opening the valve for process gas, an outflow of the highly-concentrated and poorly-diluted process gas can be suppressed. It is possible to add the dilution gas to the process gas without the outflow of the process gas from the dead volume with this configuration.

Moreover, if the final step of the process reaches a stage where no more process gas needs to flow, a process of first closing the valve for process gas and flowing only the dilution gas may be performed. Particularly, there is a control method, for a gas having corrosiveness, of keeping the diaphragm side clean and having an effect of decreasing the concentration of the corrosive gas.

According to the gas supply apparatus of the present invention, the purge gas can be supplied to the process gas that needs purging and the dilution gas can be supplied to the process gas that needs dilution without the dead volume, and a replacement speed of gas required by the vacuum processing apparatus can be controlled with a valve switching time (normally within sub-second) to contribute to the improvement of gas processing performance (improvement of processing accuracy and decrease in processing time). Furthermore, back diffusion of other gases and reaction products can be suppressed by constantly flowing gases in both of the chamber line (supply pipe) and the exhaust line (exhaust system) and by providing the gas valves in the final stages of these lines. In other words, during processing the sample, the purge gas is constantly flowed from the upstream sides of the collective pipes on the supply sides to the processing chamber of all the gas supply blocks, and a predetermined process gas is processed in accordance with the progress status of each processing step while selecting a gas to be used by the opening and closing of the processing chamber supply valves for process gases forming the collective pipe, to allow gas to constantly flow in supply pipes connected to the processing chamber of any gas supply block.

Therefore, when gas is supplied to the vacuum processing apparatus that performs etching, film formation, and ashing of the state-of-the-art device and further performs processing using the ALD and ALE, it is possible to provide the gas supply apparatus that can perform high-precision gas switching control while suppressing particles from the gas line. As a result, the device performance improvement by high-precision processing of the vacuum processing apparatus and the reproducibility of each processing can be secured, and the yield improvement can be achieved by reducing particles.

Hereinafter, each embodiment of the present invention will be specifically described by using FIG. 1 to FIG. 12.

First Embodiment

A gas supply apparatus and a gas supply method of controlling the flow of gas and the flow path according to the present embodiment will be described. In FIG. 1, a vacuum processing apparatus (the entire is not illustrated) connected to the gas supply apparatus includes a chamber 3 (reactor etc.) that stores therein a stage 2 on which a workpiece 1 (sample) is mounted and is isolated from the atmospheric air to be set to a predetermined internal pressure.

A gas dispersion room 4 (secondary room) is provided above the chamber 3 facing the stage 2. A top plate 5, a spacer 6a, a gas dispersion plate 7a, a spacer 6b, a gas dispersion plate 7b, a spacer 6c, and a shower plate 8 are provided inside the gas dispersion room 4 in this order from above. A halogen lamp 10 that is a source of infrared light is provided on the atmospheric side near the outer periphery of the upper end of the chamber 3 so as to surround the shower plate 8. The infrared light emitted from the halogen lamp 10 whose outside is covered with a cover 12 is injected into the chamber 3 including the workpiece 1 through a transmission window 11. A gate valve 15 for loading and unloading the workpiece 1 is attached to a side wall of the chamber 3, and is opened and closed by a gate valve drive shaft 16.

The gases inside the chamber 3 are designed to be collected into an exhaust pipe 20 on a back surface side (lower side) of the stage 2 from the chamber 3 through a plurality of exhaust ports (20a and 20b) and be evenly discharged from the periphery of the workpiece 1. The gases collected in the exhaust pipe 20 reach a main valve 22 through a connection pipe 26 after the exhaust speed is adjusted by a pressure control valve 21. The main valve 22 is opened during the gas treatment, during the transportation of the workpiece 1, and during an idle state waiting for the injection of the workpiece 1 to constitute a part of an exhaust passage.

In cleaning the inside of the chamber 3, parts replacement, maintenance, etc. the main valve 22 is closed when the chamber 3 is opened to the atmosphere. A dry pump 25 is connected to the downstream side of the main valve 22 and is driven to discharge gas. The gas exhausted from the dry pump 25 is discharged into the atmosphere after being further detoxified by an exhaust gas processing apparatus etc. (not illustrated). The pressure of the inside of the chamber 3 and the pressure of an exhaust pipe 27 connecting the main valve 22 and the dry pump 25 are respectively monitored by pressure gauges 28 and 29 connected to them.

In FIG. 1, a gas box 30 connected to the vacuum processing apparatus is illustrated with a broken line to surround it. The gas box 30 that is the gas supply apparatus includes a plurality of solenoid valves configured to control the opening and closing of air-operated valves that are not illustrated and components configured to respectively fulfill a detection function at the time of gas leakage, a function of further exhausting a housing with a duct during gas leakage, a function of constantly monitoring a negative pressure (being exhausted) of the internal space of the gas box 30. In the gas box 30 illustrated in FIG. 1, only element components that directly contact with the process gas are expressed with symbols. Herein, a mark a indicates a gas source supplied from other than a building in which the processing apparatus is installed, and the ports of twelve gas sources are indicated by symbols of A to F and L to Q.

The vacuum processing apparatus illustrated in FIG. 1 is a processing apparatus that supplies thermal energy to the workpiece 1 by using the halogen lamp 10 and activates gas to promote a reaction. However, the vacuum processing apparatus may be an apparatus that previously forms active gas by using plasma generated by another gas excitation means, for example, a radio frequency power source or by heating the inside of the gas dispersion room 4 and blows the active gas onto the workpiece 1. Moreover, excitation timings etc. for the processing may be different from each other.

Moreover, an exhaust means from the chamber 3 performs the exhaust by using the single dry pump 25 in the present embodiment, but may further employ an exhaust means having a large displacement volume such as a turbo molecular pump (not illustrated) between the chamber 3 and the dry pump. Moreover, another exhaust means such as a mechanical booster pump may be used.

Furthermore, by heating the gas introduction pipe, the chamber, the exhaust ports 20a and 20b, the exhaust pipe 20, the connection pipe 26, the exhaust pipe 27, the pressure control valve 21, the main valve 22, and the like, the attachment of a reaction product and gas (materials that are particularly liquefied at room temperature and are heated and gasified) having low vapor pressure onto their surfaces can be reduced, and consequently the attachment onto the workpiece 1 can be reduced. Also in the present embodiment, the apparatus includes means (not illustrated) for heating these components. Specifically, a heating temperature was adjusted within a range of 100° C. to 250° C. so that a temperature becomes higher as the gas flows downstream.

Note that pressure gauges 38 and 39 provided in a combustible gas block and pressure gauges 48 and 49 provided in an oxidizing gas control block monitor whether supply pressures of collective pipes to which the pressure gauges are attached do not exceed a constant pressure (in many cases, atmospheric pressure) and whether gas flows so as to be able to detect the blockage in the pipe and the valve opening/closing trouble caused by reaction products etc.

Figure 2:
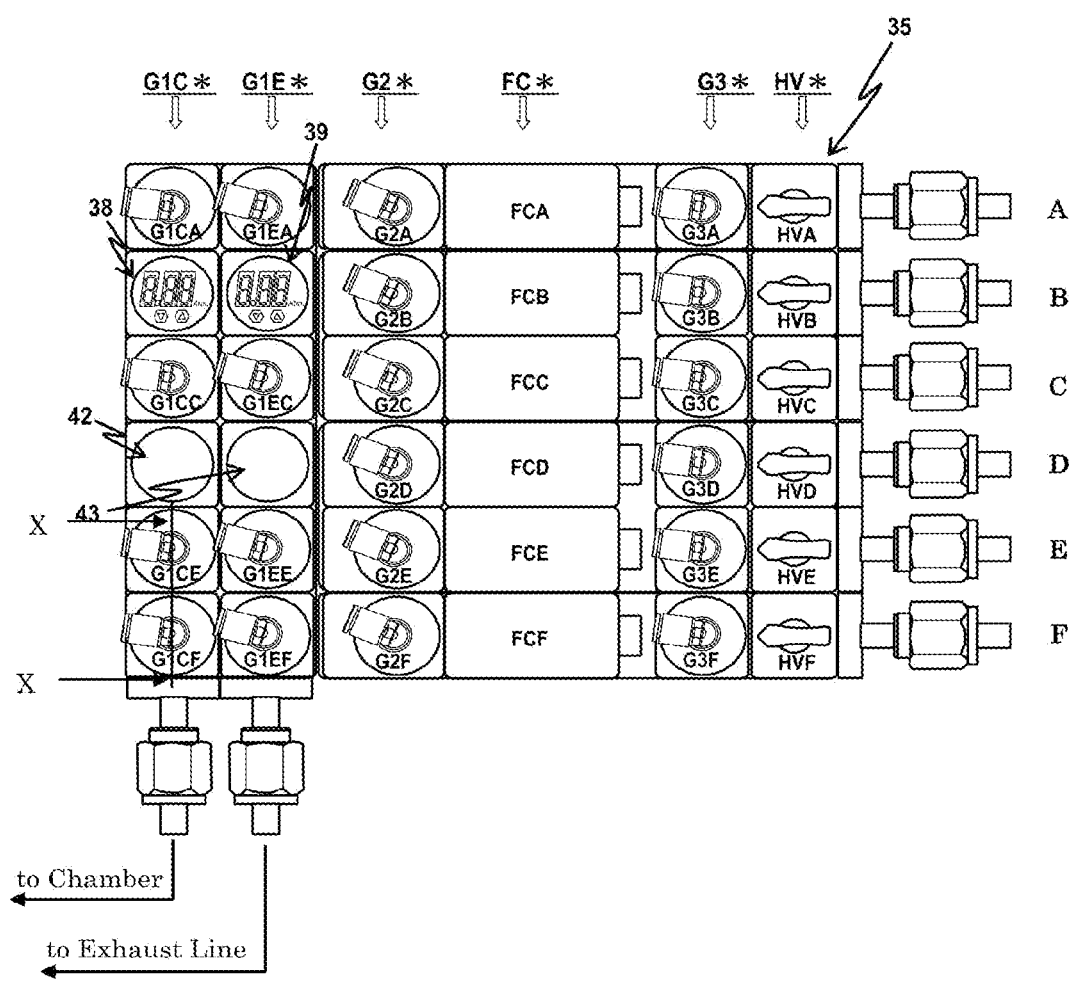
FIG. 2 is a configuration diagram of a block including valves of the gas supply apparatus extracted from FIG. 1.

FIG. 2 illustrates the gas supply apparatus of which the upper half block of the gas box 30 illustrated in FIG. 1, that is, the combustible gas block has integrated valves. In FIG. 2, air pipes to drive the air-operated valves and electric wires for power and electrical signals required for the flow rate controllers are omitted without being illustrated. Each device is attached to a base 35 to which devices for integrated valves are attached according to the standard.

Moreover, to facilitate the determination of individual devices, the devices are numbered directly. The pressure gauge 38 configured to monitor a pressure inside the collective pipe supplying gas to the chamber side and the pressure gauge 39 configured to monitor a pressure inside the collective pipe for gas to be discarded onto the exhaust pipe side are arranged on the base block having the integrated valves. Upper lids to make gas pass through instead of the attached devices are attached to free ports 42 and 43 in which there is no attached device, but a prescribed block that only communicates directly with the top and bottom may be attached or a through-hole may be provided on the base block side.

Figure 3:
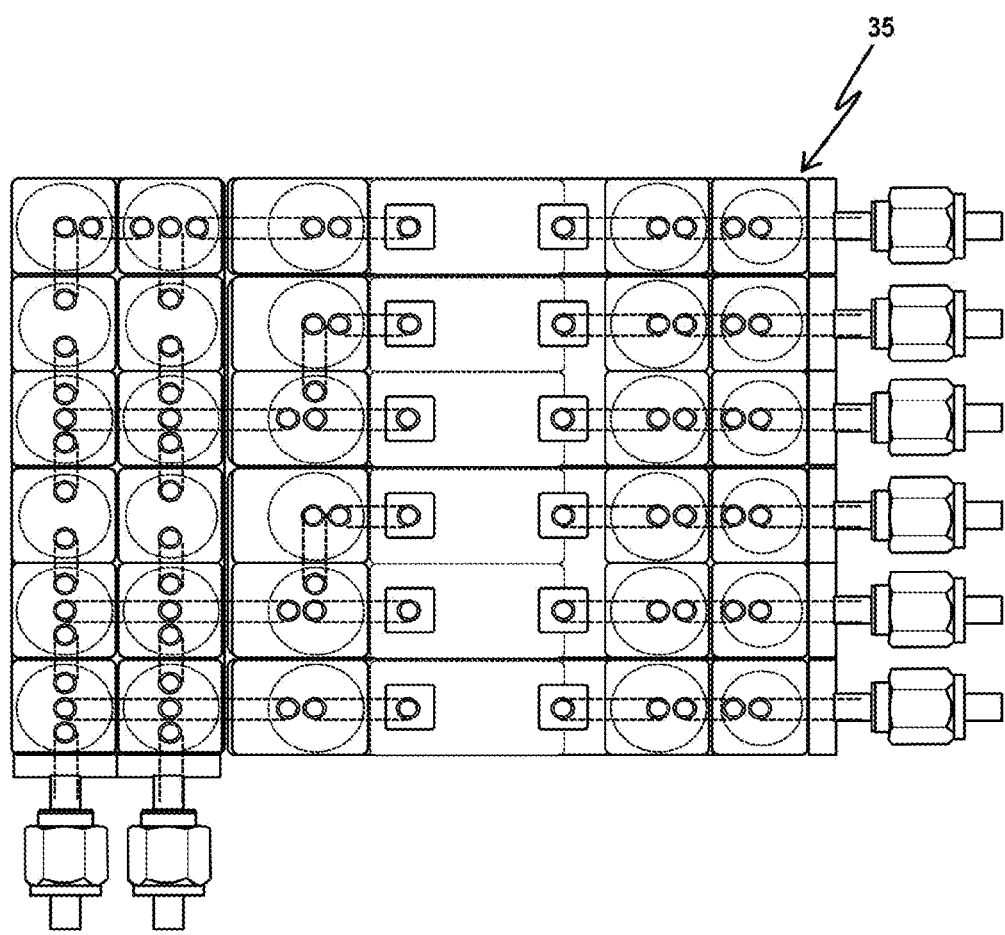
FIG. 3 is a structural diagram illustrating a clarified gas path by removing a part of the configuration illustrated in FIG. 2.

FIG. 3 is a diagram schematically illustrating connection of a gas hole of each device on the attachment receiving side by removing each attached device in FIG. 2. A machined hole indicated by double circles is a gas flow path, and a flow path connected by the bottoms of the holes is indicated with a broken line. The installation part of a special three-way valve has three double circles, and the installation part of a two-way valve has two double circles. In the special three-way valve, the central hole is a passage to open and close with the diaphragm and the surrounding holes are for gas flow in and out to constantly communicate with each other on the diaphragm side. In the two-way valve, the central hole is a passage that communicates by the opening and closing of the diaphragm on the anti-diaphragm side, and the peripheral hole is on the diaphragm side. The process gases whose flow rates are controlled by the C and E series and that are respectively mixed with the dilution gases from the B and D series and the process gas whose flow rate is controlled by the F series are introduced into the collective pipes (gas manifolds) formed by the special three-way valve downstream of the A series located on the uppermost stream side.

In the present embodiment, the upper half block (including ports A to F) of the gas box 30 and the lower half block (including ports L to Q) employ the same configuration, and the upper half block (gas supply block) is used for the combustible gas control and the lower half block (gas supply block) is used for the oxidizing gas control. When the type of gas supplied to each port is specifically described, in the combustible gas block, A: Ar, B: Ar, C: $NH_3$, D: Ar, E: $CH_4$, and F: $H_2$. On the other hand, in the oxidizing gas block, the type of gas supplied to each port is as follows: L: Ar, M: Ar, N: $NF_3$, O: Ar, P: $Cl_2$, and Q: $O_2$. Furthermore, blocks and supply lines may be added to 3 systems or 4 systems by grouping the types of gas that cannot be mixed, but a case of 2 systems is described as an example in the present drawing. In other words, gas supply blocks are formed for respective types of gases that cannot be mixed inside a common collective pipe and a supply pipe, and the collective pipe is provided for each of the gas supply blocks.

In FIG. 1, the process gases introduced into the gas box 30 from the gas sources through the ports A to F and L to Q are flow-controlled by flow rate controllers FC* by way of manual valves HV* (herein, * is one symbol of A to F and L to Q corresponding to ports, the same applies hereinafter) and upstream-side valves G3*, and are guided to downstream-side valves G2*. Then, the process gases are flowed out through valves G1C* on the line toward the chamber, or the waste gases are flowed out through valves G1E* on the line toward the exhaust line. Herein, flow paths of gases flowing to the downstream side from the gas sources through the ports * are called * series.

To clarify the attaching direction of the valve in the valve notation of FIG. 1, a diaphragm-side connection port is indicated with a black triangle (▲) as a port constantly (normally) closed (closed when there is no air supply when the solenoid valve is not excited). Therefore, A surrounded with a circle of an air symbol for driving is expressed on the apex side of the black triangle (▲). On the other hand, the port side of the valve that constantly communicates around the diaphragm is indicated with a white triangle (Δ). Therefore, the black triangle (▲) and the white triangle (Δ) are expressed at an angle of 90° in the two-way valve, but the valve is not always an L-shaped valve normally expressed at 90°.

The combustible gas block illustrated in FIG. 1 includes two collective pipes (chamber line and exhaust line) in which gases passing through the A series to the F series are mixed and flowed, and the oxidizing gas block includes two collective pipes (chamber line and exhaust line) in which gases from the L series to the Q series are mixed and flowed.

In the combustible gas block, valves from the valve G1CA to the gas valve GCF1 are called a collective pipe (or first supply pipe) of the chamber line, and valves from the valve G1EA to the exhaust valve GEF1 are called a collective pipe (or first waste gas pipe) of the exhaust line. The gas is supplied to the chamber 3 through the gas valve GCF1 to perform gas treatment. Moreover, the gas is exhausted to the exhaust pipe 27 through the exhaust valve GEF1 and is flowed out without going through the chamber.

Moreover, in the oxidizing gas block, valves from the valve G1CL to the gas valve GCF2 are called a collective pipe (or second supply pipe) of the chamber line, and valves from the valve G1EL to the exhaust valve GEF2 are called a collective pipe (or second waste gas pipe) of the exhaust line. The gas is supplied to the chamber 3 through the gas valve GCF2 to perform gas treatment. Moreover, the gas is exhausted to the exhaust pipe 27 through the exhaust valve GEF2 and is flowed out without going through the chamber.

The A series of the collective pipe on the uppermost stream side in the combustible gas block and the L series of the collective pipe on the uppermost stream side in the oxidizing gas block are provided as flow paths for purge gas (Ar gas in the present embodiment) that is constantly flowed out during gas treatment or during loading/unloading of the workpiece 1. Note that, because the combustible gas block and the oxidizing gas block are substantially similar, the combustible gas block will be mainly described as follows.

The valves in the combustible gas block employ air-operated valves that open and close flow paths by using the pneumatically driven diaphragms, and the valves are automatically opened and closed in accordance with the recipe via a control device not illustrated.

Figure 4:
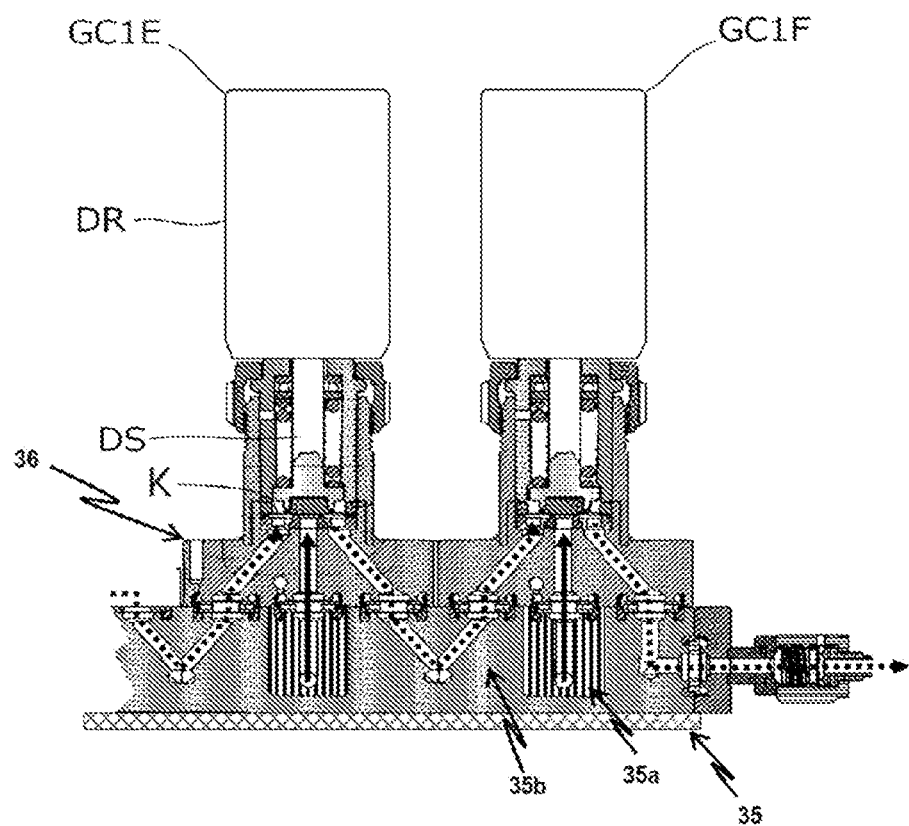
FIG. 4 is a cross-sectional view taken along the X-X line in the block of FIG. 2.

FIG. 4 is a cross-sectional view taken along the X-X line in the block of FIG. 2. In FIG. 4, two valves GC1E and GC1F that are special three-way valves (also called simply three-way valves) are attached to the base 35 having flow paths by using a base block 35a and a base block 35b. Although it is not illustrated, other valves GC1* are similarly attached to the base 35 by using the base block 35a and the base block 35b. Because the valves GC1E and GC1F have a common configuration, the valve GC1E will be described as follows.

In the valve GC1E that is an air-operated valve, an air cylinder driving unit DR that receives an air pressure from an air source not illustrated to make a drive shaft DS move up and down is fixed to a valve block 36. A diaphragm K fixed and held around that opens and closes with respect to the central hole is arranged at the tip of the drive shaft DS.

The drive shaft DS is pushed by a spring downward and is displaced in accordance with a control signal to press the diaphragm K. The pressed diaphragm K closes the central hole to suspend the flow of gas of the E series indicated by the solid arrow. On the other hand, the collective pipe (manifold) side indicated by the dotted line is constantly in communication around the lower side of the diaphragm K. When air is supplied and the drive shaft DS is displaced upward, the gas of the E series indicated by the solid arrow flows out to the collective pipe as indicated by the dotted arrow because the center of the diaphragm K rises and the central hole is opened.

As is apparent from FIG. 4, the downstream-side passage of the valve GC1E communicates with the upstream-side passage of the valve GC1F. Therefore, regardless of operations of the valve GC1E and the valve GC1F, the upstream-side passage of the valve GC1E constantly communicates with the downstream-side passage of the valve GC1F, and the gas of the A series constantly flows in the passage as indicated by the dotted arrow. A part of the collective pipe is formed by these passages.

In the combustible gas block, valves G1CC, G1CE, G1CF, G1EA, G1EC, G1EE, G1EF, G2C, and G2E that are arranged as the joining part of gas are special three-way valves. The combustible gas block has a structure that other valves (also called two-way valves) are attached to the places where only the inlet flow path and downstream-side flow path are formed in the base 35 and the diaphragm opens and closes the inlet flow path according to the displacement of the drive shaft. Although the valve is indicated by a diaphragm valve using a sealing method by a diaphragm in the present embodiment, the valve may employ a bellows valve for sealing the inlet flow path of the central hole with the tip itself of the shaft by using the bellows drive.

Herein, in the valve using the diaphragm, the surrounding hole side is defined as the diaphragm side and the central hole side is defined as the anti-diaphragm side.

In FIG. 1, the B series is a dilution gas control flow path for a process gas C, and the D series is a dilution gas control flow path for a process gas E. Valves G2B and G2D respectively provided downstream of flow rate controllers FCB and FCD of the B series and the D series have the arrangement that dilution gases B and D are injected from the diaphragm side and are flowed out to the anti-diaphragm side when the valves are opened. The valves G2C and G2E respectively provided downstream of the flow rate controllers of the C series and the E series have the arrangement that the process gases C and E are flowed out from the diaphragm side to the anti-diaphragm side in a state where the valves are opened.

The diaphragm side of the surrounding holes of the valves G2C and G2E are constantly connected to the anti-diaphragm side of the valves G2B and G2D for the dilution gases B and D. With this configuration, the control of each step in the recipe setting may close the valve G2B or G2D without activating the B series or the D series when the dilution gas is not used. As a result, in the step of using the process gases C and E of the C series and the E series, the gases are used without being diluted.

The process gases C and E to be used at this time are flowed backward and diffused to the anti-diaphragm side of the valve G2B or G2D. When the dilution is started in the next step control, the B series is activated and the valve G2B is opened, or the D series is activated and the valve G2D is opened. At this time, in the previous step control, the process gases C and E diffused up to the anti-diaphragm side of the valve G2B or G2D are pushed back downstream together with the start of the supply of the dilution gases B and D, but the dilution can be started without any joining pipe and dead volume. When controlling a step without dilution is started, the dilution gases B and D (herein Ar) remain on the anti-diaphragm side of the central hole of the valve G2B or G2D, but the gases do not affect any gas treatment because the gases are generally the purge gas and do not have reactivity.

Next, the role of a purge line provided at the top of the combustible gas block and its control will be described. The one gas valve GCF1 provided above the gas dispersion room 4 is the final-stage valve for supplying a combustible gas to the chamber. Moreover, the other gas valve GCF2 is the final-stage valve for supplying an oxidizing gas to the chamber.

The process gases to be flowed out to the chamber 3 from the gas valves GCF1 and GCF2 through nozzles 9b and 9a are evenly dispersed in the radial direction up to the outer periphery of the shower plate 8 facing the workpiece 1 by way of the spacers 6a to 6c and the gas dispersion plates 7a and 7b. This is a common method used to obtain a gas outflow area having a diameter appropriate to the processing of the workpiece 1.

In this regard, however, the apparatus of the present embodiment is configured to separately flow out a combustible gas from the outer peripheral side of the shower plate 8 and an oxidizing gas from the central side of the shower plate 8. In the case of an actual vacuum processing apparatus as with the present drawing that is a schematic diagram, the gas dispersion room 4 has a structure that the process gases that have left the upper gas valves GCF1 and GCF2 are not mixed with the other gas and the gas flow paths are expanded up to the back surface of the shower plate 8.

In the vacuum processing apparatus with such a configuration, it is desirable that the process gas is controlled to be introduced into the internal space of the chamber 3 and to be mixed with process gas having other properties for the first time there. When a combustible gas is caused not to be flowed for example, an oxidizing gas to be used may diffuse back. Specifically, an oxidizing gas diffuses up to the anti-diaphragm side in a state where the gas valve GCF1 is closed, and the oxidizing gas may diffuse up to the further upstream collective pipe for combustible gas when the gas valve GCF1 is not closed. Moreover, not only the oxidizing process gas but also a reaction product may also enter the combustible gas line by back diffusion.

Moreover, when the supply of the combustible gas is stopped and then the supply of the combustible gas is resumed, gas mixing may occur inside the gas dispersion room 4 or inside the gas supply line. In this case, there are caused troubles such as corrosion by the intrusion of oxidizing gas and generation of metal contamination or foreign matter (particle) caused by the intrusion of a reaction product and the formation of a new reaction product.

To solve this problem, it is effective to continue to constantly flow the purge gas from the combustible gas block even when the combustible gas is not used. In the present embodiment, first during the gas treatment, the basic control is to continue to flow the purge gas from a purge line provided at the uppermost stream of each block. When performing the gas control, the control is to activate a gas control line for the A series, constantly open the valve G1CA, and flow the purge gas in the collective pipe.

In accordance with the step control of the recipe setting, the process gas of the required combustible gas or the dilution gas is mixed with the purge gas by the collective pipe in the combustible gas block. The gas of the C series, the gas of the E series, and the gas of the F series are respectively mixed with the purge gas supplied through the upstream-side valve G1CA in the valve G1CC, the valve G1CE, and the valve G1CF. When a combustible gas is not flowed at all, only the purge gas will be flowed as described above. The control for the lower-side oxidizing gas block is also similar.

Next, in the same apparatus of FIG. 1, the control of cyclically switching between gases of ALD, ALE, Bosch process, etc. to perform gas treatment is considered. In the control for the gas treatment, taking into account an internal volume of the chamber 3, a surface area of the workpiece 1, a reaction speed in the workpiece 1, and the like, a gas flow rate, a gas flow time, the number of switchings, and order are considered. In many gas treatments, it is most important to devise so that the pressure of the chamber 3 is not extremely changed.

When a gas pressure is extremely changed by the gas switching etc., it is not preferable because the entire gas flow is changed and thus reproducible performance for each process is not obtained and particles are attached to the workpiece 1.

In the present embodiment, when cyclically switching between gases, the gases are simultaneously flowed to a line for purge gas and a line for process gas (one series gas or multiple series gas) installed on the uppermost stream side, and are respectively flowed to the respective opposite lines of the supply line to the chamber and the exhaust line for the waste gas.

Basically, the adjustment of a gas flow rate is suppressed as much as possible when gas begins to flow, and both the purge gas and the process gas are controlled and flowed at a constant flow rate. While the purge gas is flowing to the chamber side, the process gas is caused to flow out downstream from the chamber through the collective pipe of the exhaust line. When the process gas is flowed to the chamber side, the purge gas is caused to flow out downstream from the chamber through the collective pipe of the exhaust line.

According to the present embodiment, by only switching between the opening and closing of four (or six, eight) gas valves substantially simultaneously, the supply destination of each gas can be switched between the chamber and the downstream side of the chamber and the switching of gas can be cyclically performed on the workpiece 1. As with the control method described above, the chamber supply line is controlled not to have a time in which gas does not flow. Similarly, the exhaust line is also controlled not to have a time in which gas does not flow.

The present embodiment will be described in an organized manner. The purge gas line is installed on the uppermost stream side of the block having the collective pipe that can supply gases having different properties in common, and the chamber line that supplies gas to the chamber performing gas treatment and the exhaust line that causes gas to flow out to the outside of the chamber are provided. Moreover, a valve that can supply and add the process gas is provided in the collective pipe of each supply destination where the purge gas flows from the uppermost stream side.

The process gas can be caused to flow from the diaphragm side to the anti-diaphragm side by using a special three-way valve as the gas valve that supplies and adds the process gas. The diaphragm-side peripheral part of the special three-way valve is caused to communicate between valves that supply and add all process gases to form the collective pipe.

Similarly, for the process gas that needs dilution, the anti-diaphragm side of the upstream two-way valve that supplies the dilution gas is connected to the diaphragm side of the three-way valve that supplies the process gas from the diaphragm side to the anti-diaphragm side. In this way, the basic configuration is to construct a dilution line that can begin to flow the dilution gas toward the process gas without a dead volume.

Figure 5:
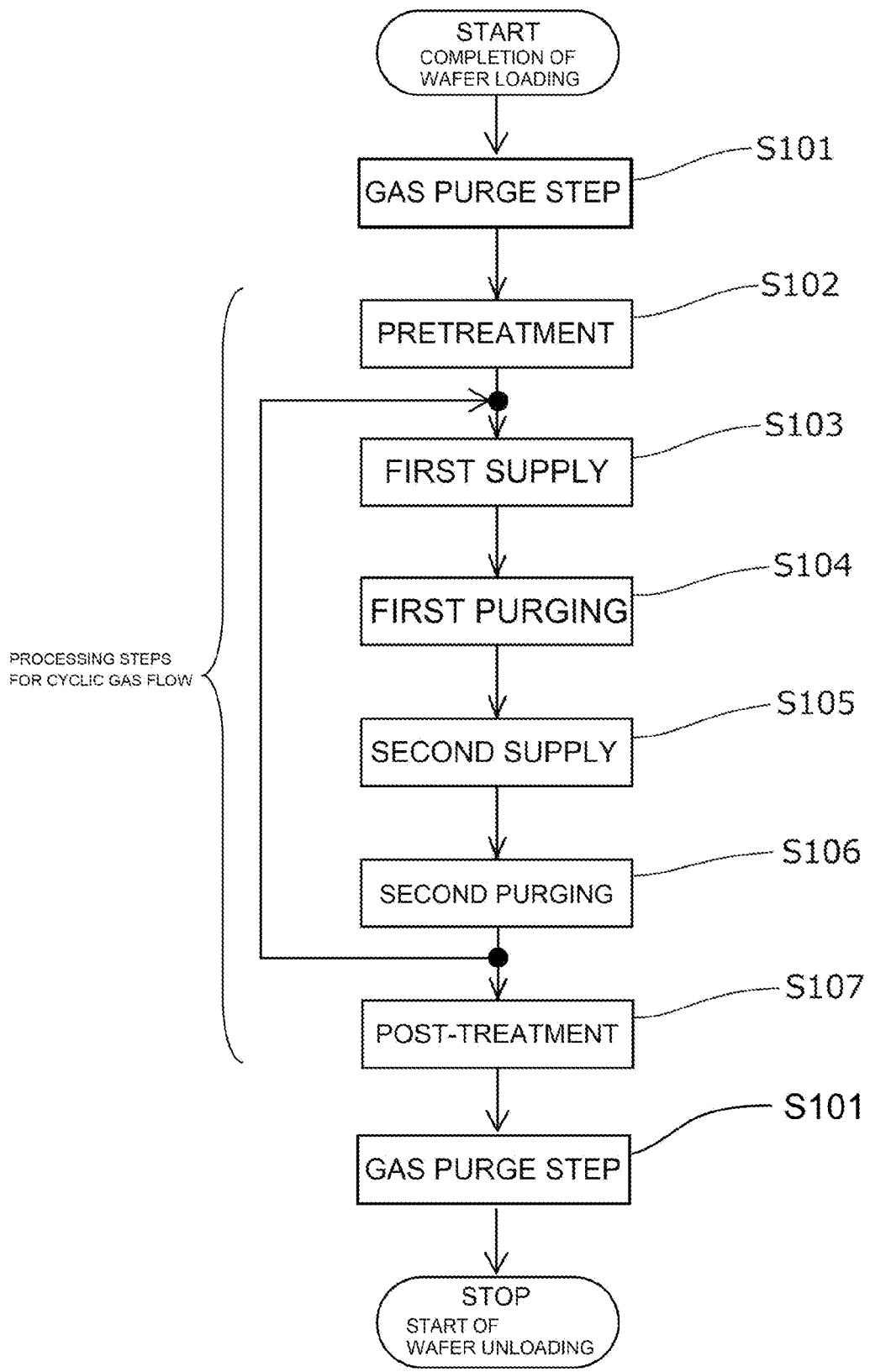
FIG. 5 is a flowchart illustrating an example of a gas treatment.

Hereinafter, an example of a specific gas supply method will be described. FIG. 5 is a flowchart illustrating steps of gas treatment in a process recipe. During the transportation of a wafer that is the workpiece 1, it may be performed under vacuuming in which gas does not flow at all or it may be performed under purging of an inert gas to the processing chamber 3. In the present embodiment, the case where gas purging is continuously performed even during the transportation (during loading and during unloading) of the wafer that is the workpiece 1 will be described.

Moreover, the details of processing steps other than a process of cyclically switching between gases are not described, but, before performing a pretreatment of Step S102 of cyclically switching between gases, that is, after the wafer loading of Step S101, different processing step may be inserted and performed. Furthermore, similarly, steps cyclically repeated from Step S103 to Step S106 are terminated after the prescribed number of times or after detecting the end point of etching, and different processing step may be inserted and performed before the gas purge step is again performed in Step S101, that is, after completing Step S107 of a post-treatment.

Moreover, in the present embodiment, the processing step of cyclically switching between gases is described as one run implementation within the whole processing, but there is no problem even if the process of cyclically switching between gases is performed multiple times by switching between the types of gas during processing the wafer that is the one workpiece 1.

FIGS. 6 to 12 are diagrams respectively illustrating the flow of gas in Step S101 to Step S107 in the combustible gas block and the oxidizing gas block. Herein, the control states of the gas treatment when cyclically switching between gases to perform processing by using the A-series purge gas A (Ar), the D-series diluting process gas (Ar), the E-series process gas E (CH$_4$), the L-series purge gas L (Ar), and the P-series process gas P (Cl$_2$) are illustrated, and gas valves for other series illustrated in FIGS. 6 to 12 are closed.

First, the setting of a gas purge step in Step S101 of FIG. 5 inherits the set state before unloading the wafer from the chamber 3 after completing the processing of the wafer that is the workpiece 1. The opening and closing of the valves and the adjusted flow rates of the flow rate controllers are controlled as follows.

A series: G1CA (open), G1EA (close), G2A (open), FCA (300 ml/min), and G3A (open);
D series: G2D (close), FCD (0 ml/min), and G3D (close);
E series: G1CE (close), G1EE (close), G2E (close), FCE (0 ml/min), and G3E (close);
L series: G1CL (open), G1EL (close), G2L (open), FCL (300 ml/min), and G3L (open);
P series: G1CP (close), G1EP (close), G2P (close), FCP (0 ml/min), and G3P (close);
Chamber supply gas valve: GCF1, GCF2 (open); and
Exhaust waste gas valve: GEF1, GEF2 (close).

Figure 6:
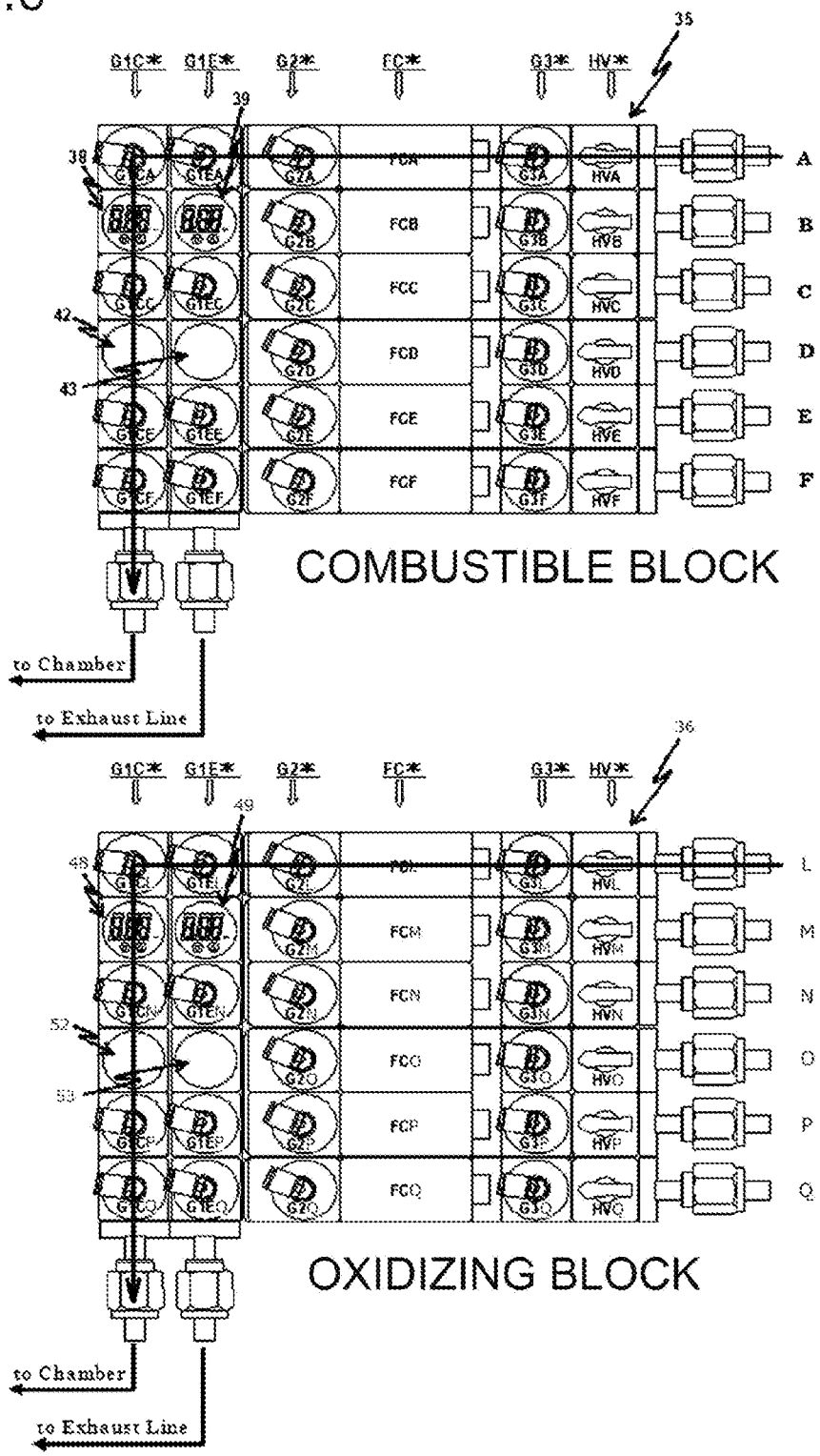
FIG. 6 is a diagram illustrating the flow of gas in a block of combustible gas and a block of oxidizing gas.

The pressure of the chamber 3 is controlled to be 100 Pa. With the above control, as illustrated in FIG. 6, the purge gas A (Ar) and the purge gas L (Ar) are provided to the chamber 3 through the chamber supply line to perform purging, but the process gases E (CH$_4$) and P (Cl$_2$) are not supplied. In the meantime, the unprocessed wafer that is the workpiece 1 is loaded on the stage 2 inside the chamber 3. The gate valve 15 is closed after loading and the chamber 3 in which the process is performed is isolated from a transportation system (not illustrated). After the loading operation is completed, the processing step is activated and the gas purge step in Step S101 is first continued for several seconds.

Next, the pretreatment of cyclically switching between gases is performed in Step S102 of FIG. 5. In this case, in the pretreatment of Step S102, the opening and closing of the valves and the adjusted flow rates of the flow rate controllers are controlled as follows. In this regard, however, the gas control pressure of the chamber 3 is controlled to be 200 Pa.

A series: G1CA (open), G1EA (close), G2A (open), FCA (150 ml/min), and G3A (open);
D series: G2D (open), FCD (120 ml/min), and G3D (open);
E series: G1CE (close), G1EE (open), G2E (open), FCE (30 ml/min), and G3E (open);
L series: G1CL (open), G1EL (close), G2L (open), FCL (150 ml/min), and G3L (open);
P series: G1CP (close), G1EP (open), G2P (open), FCP (150 ml/min), and G3P (open);
Chamber supply gas valve: GCF1, GCF2 (open); and
Exhaust waste gas valve: GEF1, GEF2 (open).

Figure 7:
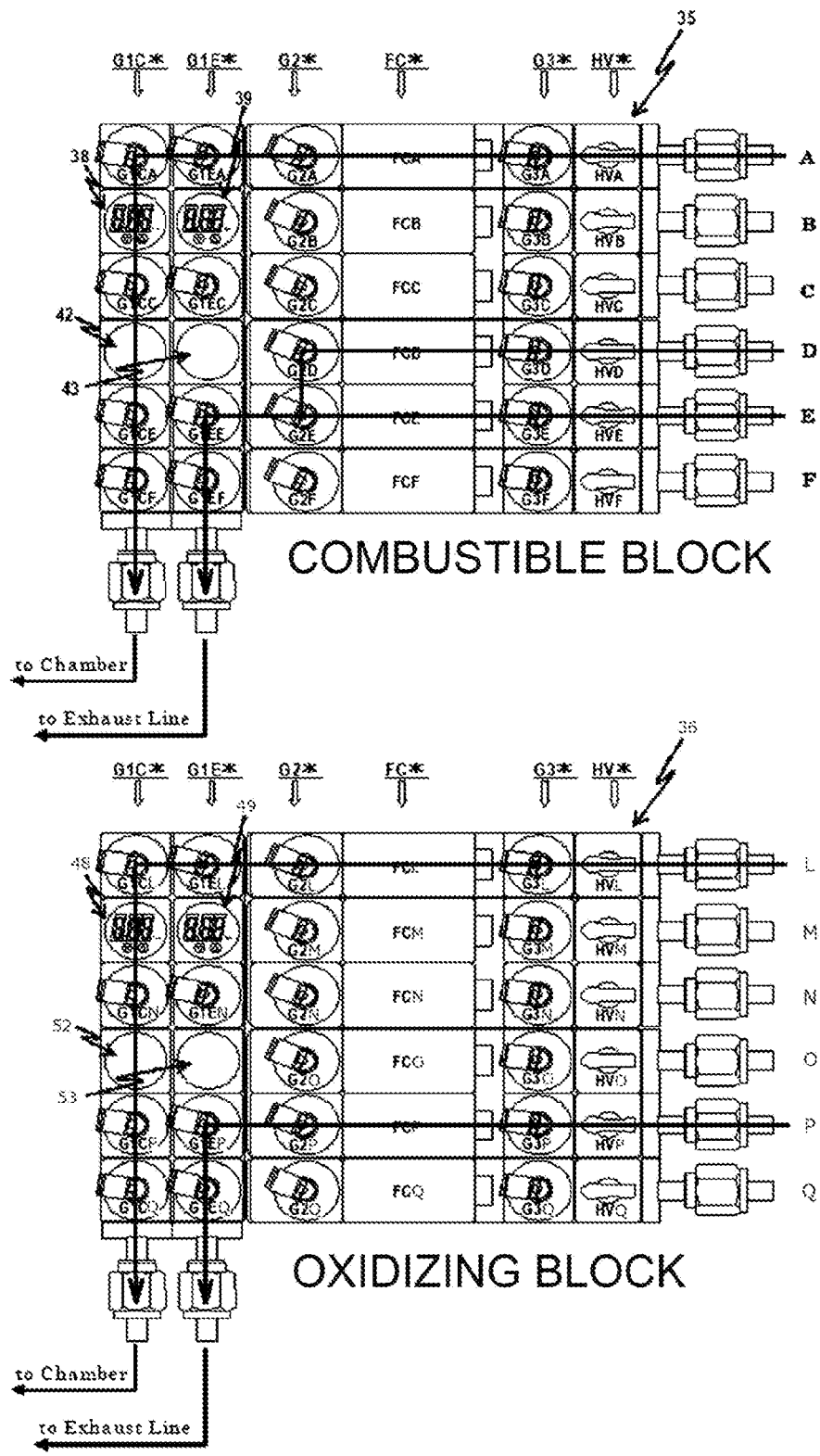
FIG. 7 is a diagram illustrating the flow of gas in the block of combustible gas and the block of oxidizing gas.

With the above control, as illustrated in FIG. 7, the purge gases A (Ar) and L (Ar) are supplied to the chamber 3 through the chamber line to continue to purge, and the process gas E (CH$_4$) and the process gas P (Cl$_2$) diluted with the diluting process gas D (Ar) are exhausted as waste gas downstream from the chamber 3 through the exhaust line. The flow rate controller controlled by FC* within a control time of about 3 seconds reaches a substantially stable flow rate. Because gas during the unstable control at the start of flow is discarded into the exhaust system, the gas does not contribute to the process of the wafer that is the workpiece 1.

Next, the first process gas supply is performed in Step S103 of FIG. 5. In this case, the opening and closing of the valves and the adjusted flow rates of the flow rate controllers are controlled as follows. In this regard, however, the gas control pressure of the chamber 3 is 200 Pa and the step time is 2.0 seconds.

A series: G1CA (open), G1EA (close), G2A (open), FCA (150 ml/min), and G3A (open);
D series: G2D (open), FCD (120 ml/min), and G3D (open);
E series: G1CE (close), G1EE (open), G2E (open), FCE (30 ml/min), and G3E (open);
L series: G1CL (close), G1EL (open), G2L (open), FCL (150 ml/min), and G3L (open);
P series: G1CP (open), G1EP (close), G2P (open), FCP (150 ml/min), and G3P (open);
Chamber supply gas valve: GCF1, GCF2 (open); and
Exhaust waste gas valve: GEF1, GEF2 (open).

Figure 8:
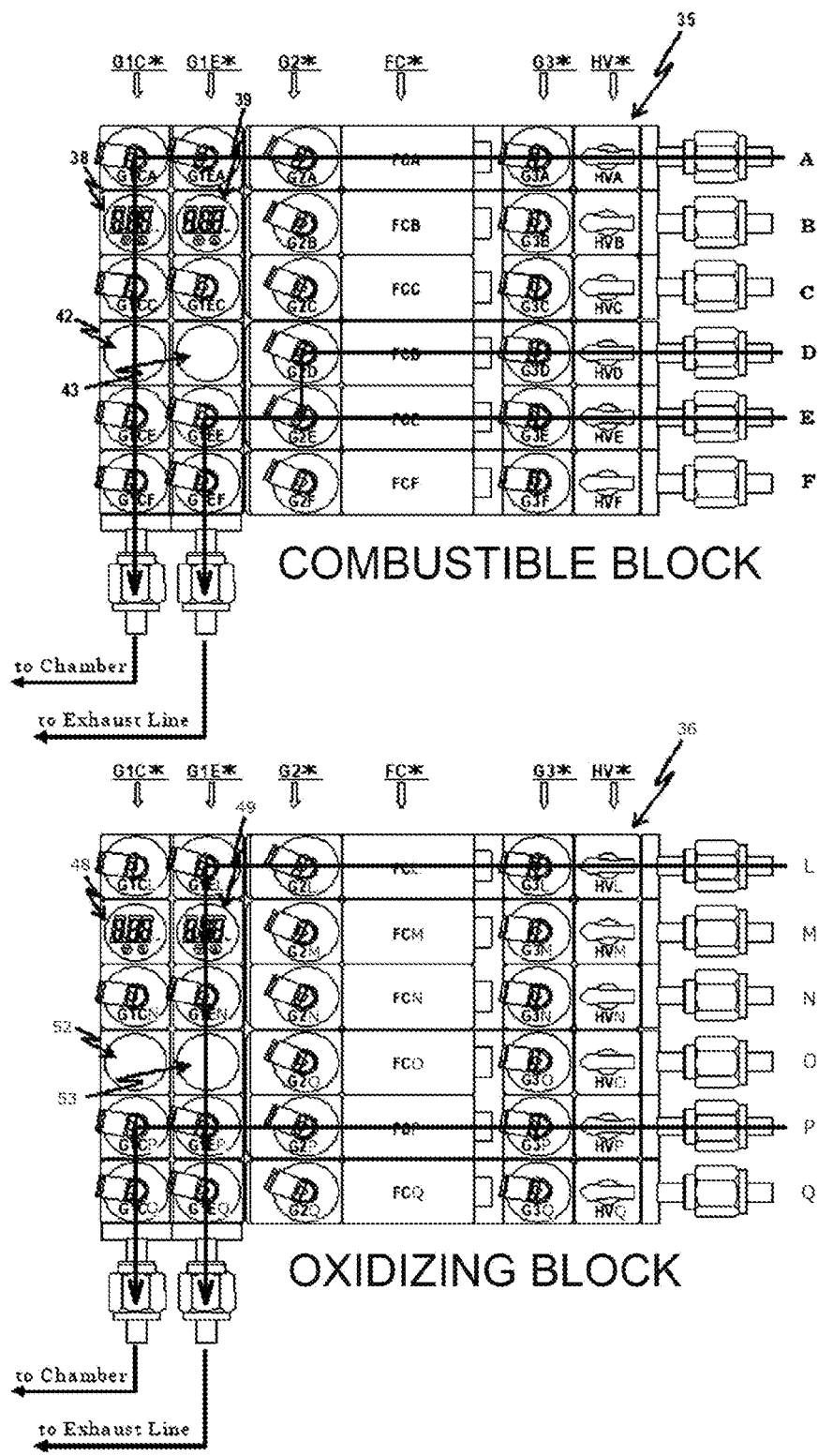
FIG. 8 is a diagram illustrating the flow of gas in the block of combustible gas and the block of oxidizing gas.

With the above control, as illustrated in FIG. 8, the combustible block side keeps the state of Step S102, but, on the oxidizing block side, the process gas P (Cl$_2$) is provided to the chamber 3 through the chamber supply line to perform the gas treatment and the purge gas L (Ar) purges the exhaust line.

Next, the first purging is performed in Step S104 of FIG. 5. In this case, the opening and closing of the valves and the adjusted flow rates of the flow rate controllers are controlled as follows. In this regard, however, the gas control pressure is 200 Pa and the step time is 2.7 seconds.

A series: G1CA (open), G1EA (close), G2A (open), FCA (150 ml/min), and G3A (open);
D series: G2D (open), FCD (120 ml/min), and G3D (open);
E series: G1CE (close), G1EE (open), G2E (open), FCE (30 ml/min), and G3E (open);

L series: G1CL (open), G1EL (close), G2L (open), FCL (150 ml/min), and G3L (open);
P series: G1CP (close), G1EP (open), G2P (open), FCP (150 ml/min), and G3P (open);
Chamber supply gas valve: GCF1, GCF2 (open); and
Exhaust waste gas valve: GEF1, GEF2 (open).

Figure 9:
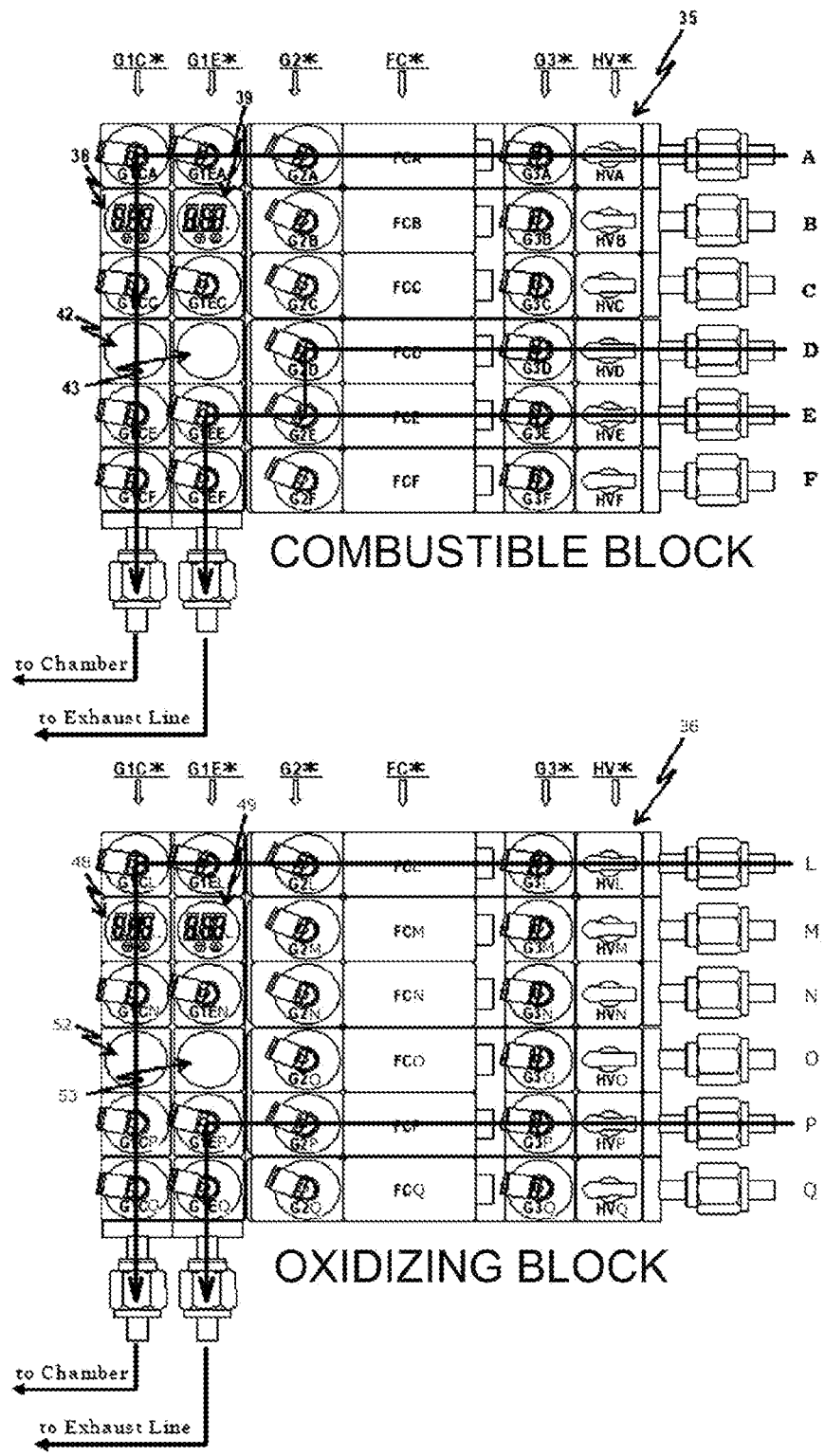
FIG. 9 is a diagram illustrating the flow of gas in the block of combustible gas and the block of oxidizing gas.

With the above control, the process returns to the same state as that of Step S102 as illustrated in FIG. 9. On the oxidizing block side, the purge gas L (Ar) purges the process gas P ($Cl_2$) remaining in the chamber supply line from the inside of the pipe. Residual gas inside the chamber 3 is also purged.

Next, the second gas supply is performed in Step S105 of FIG. 5. In this case, the opening and closing of the valves and the adjusted flow rates of the flow rate controllers are controlled as follows. In this regard, however, the gas control pressure is 200 Pa and the step time is 0.5 seconds.
A series: G1CA (close), G1EA (open), G2A (open), FCA (150 ml/min), and G3A (open);
D series: G2D (open), FCD (120 ml/min), and G3D (open);
E series: G1CE (open), G1EE (close), G2E (open), FCE (30 ml/min), and G3E (open);
L series: G1CL (open), G1EL (close), G2L (open), FCL (150 ml/min), and G3L (open);
P series: G1CP (close), G1EP (open), G2P (open), FCP (150 ml/min), and G3P (open);
Chamber supply gas valve: GCF1, GCF2 (open); and
Exhaust waste gas valve: GEF1, GEF2 (open).

Figure 10:
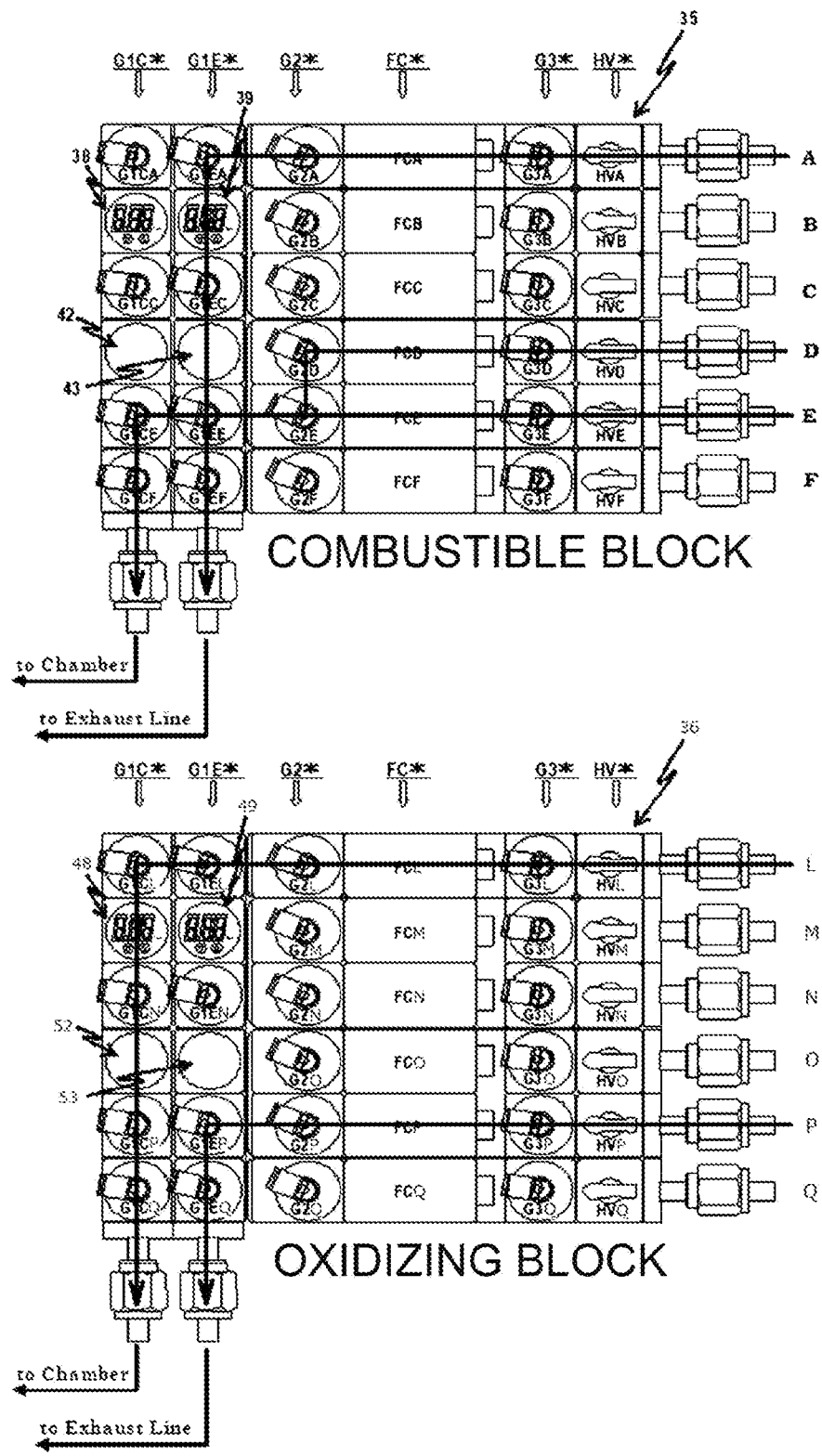
FIG. 10 is a diagram illustrating the flow of gas in the block of combustible gas and the block of oxidizing gas.

With the above control, as illustrated in FIG. 10, the process gas E ($CH_4$) diluted with the diluting process gas D (Ar) is provided to the chamber 3 through the chamber supply line to perform the gas treatment (surface attachment), and the purge gas A (Ar) purges the exhaust line to prevent the backflow from the exhaust system. On the other hand, the oxidizing block side keeps the state of Step S104.

Next, the second purging is performed in Step S106 of FIG. 5. In this case, the opening and closing of the valves and the adjusted flow rates of the flow rate controllers are controlled as follows. In this regard, however, the gas control pressure is 200 Pa and the step time is 9.8 seconds.
A series: G1CA (open), G1EA (close), G2A (open), FCA (150 ml/min), and G3A (open);
D series: G2D (open), FCD (120 ml/min), and G3D (open);
E series: G1CE (close), G1EE (open), G2E (open), FCE (30 ml/min), and G3E (open);
L series: G1CL (open), G1EL (close), G2L (open), FCL (150 ml/min), and G3L (open);
P series: G1CP (close), G1EP (open), G2P (open), FCP (150 ml/min), and G3P (open);
Chamber supply gas valve: GCF1, GCF2 (open); and
Exhaust waste gas valve: GEF1, GEF2 (open).

Figure 11:
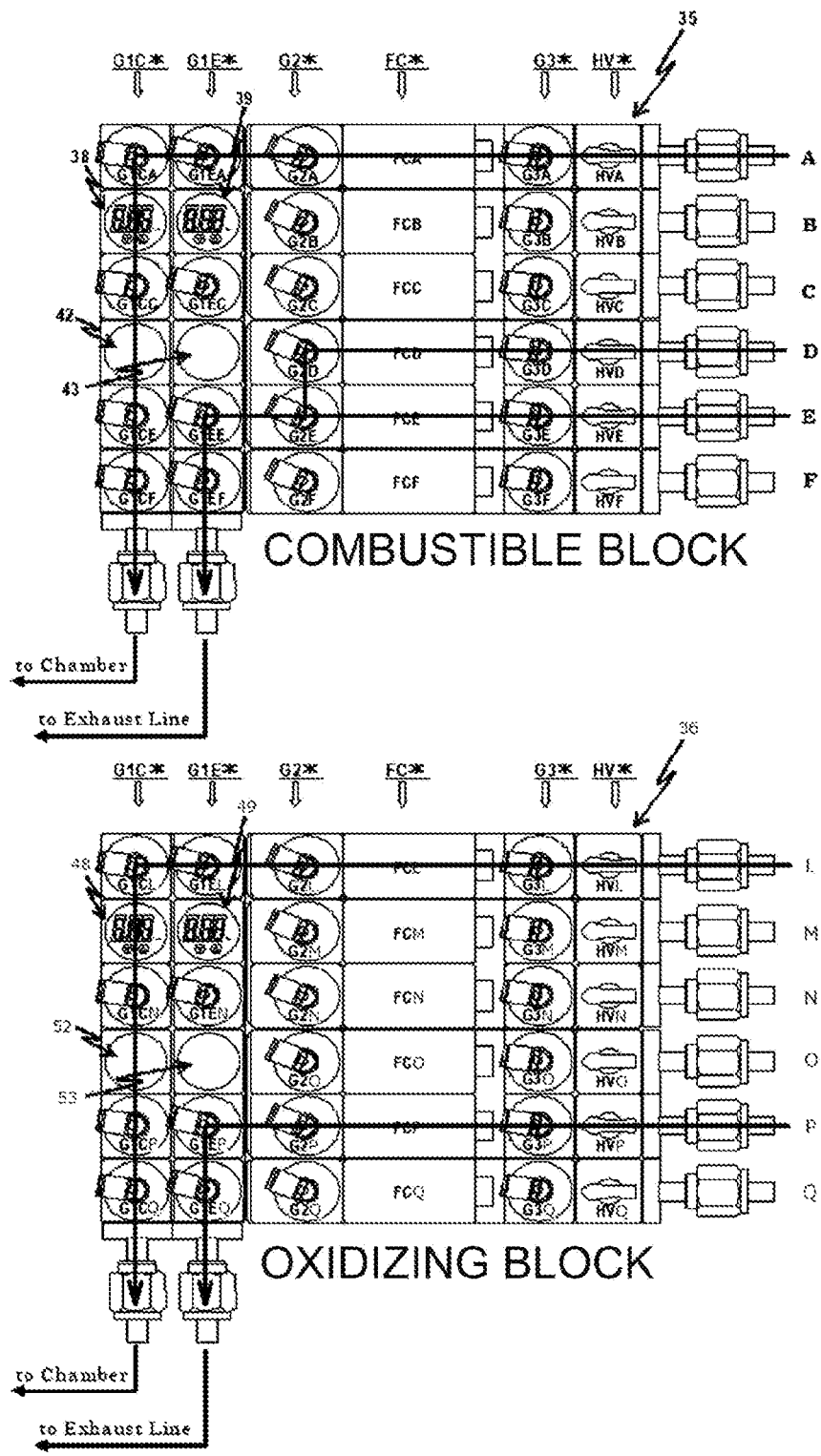
FIG. 11 is a diagram illustrating the flow of gas in the block of combustible gas and the block of oxidizing gas.

With the above control, the process is controlled as with Step S104 as illustrated in FIG. 11. In the meantime, etching is progressed by activating the halogen lamp 10 in a fixed time (about 5 seconds), warming the wafer that is the workpiece 1 to promote a reaction, and generating and scattering a highly-volatile reaction product.

As described above, a reaction is controlled by controlling a supplied amount of gas, and Step S103 to Step S106 are executed repeatedly in order until a desired etching amount is reached. A required time for one cycle is about 15 seconds in the present embodiment.

Next, if etching by the cyclic gas supply is terminated, the post-treatment is performed in Step S107 of FIG. 5. In this case, the opening and closing of the valves and the adjusted flow rates of the flow rate controllers are controlled as follows. In this regard, however, the gas control pressure is 200 Pa.
A series: G1CA (open), G1EA (open), G2A (open), FCA (300 ml/min), and G3A (open);
D series: G2D (close), FCD (0 ml/min), and G3D (close);
E series: G1CE (close), G1EE (close), G2E (close), FCE (0 ml/min), and G3E (close);
L series: G1CL (open), G1EL (open), G2L (open), FCL (300 ml/min), and G3L (open);
P series: G1CP (close), G1EP (close), G2P (close), FCP (0 ml/min), and G3P (close);
Chamber supply gas valve: GCF1, GCF2 (open); and
Exhaust waste gas valve: GEF1, GEF2 (close).

Figure 12:
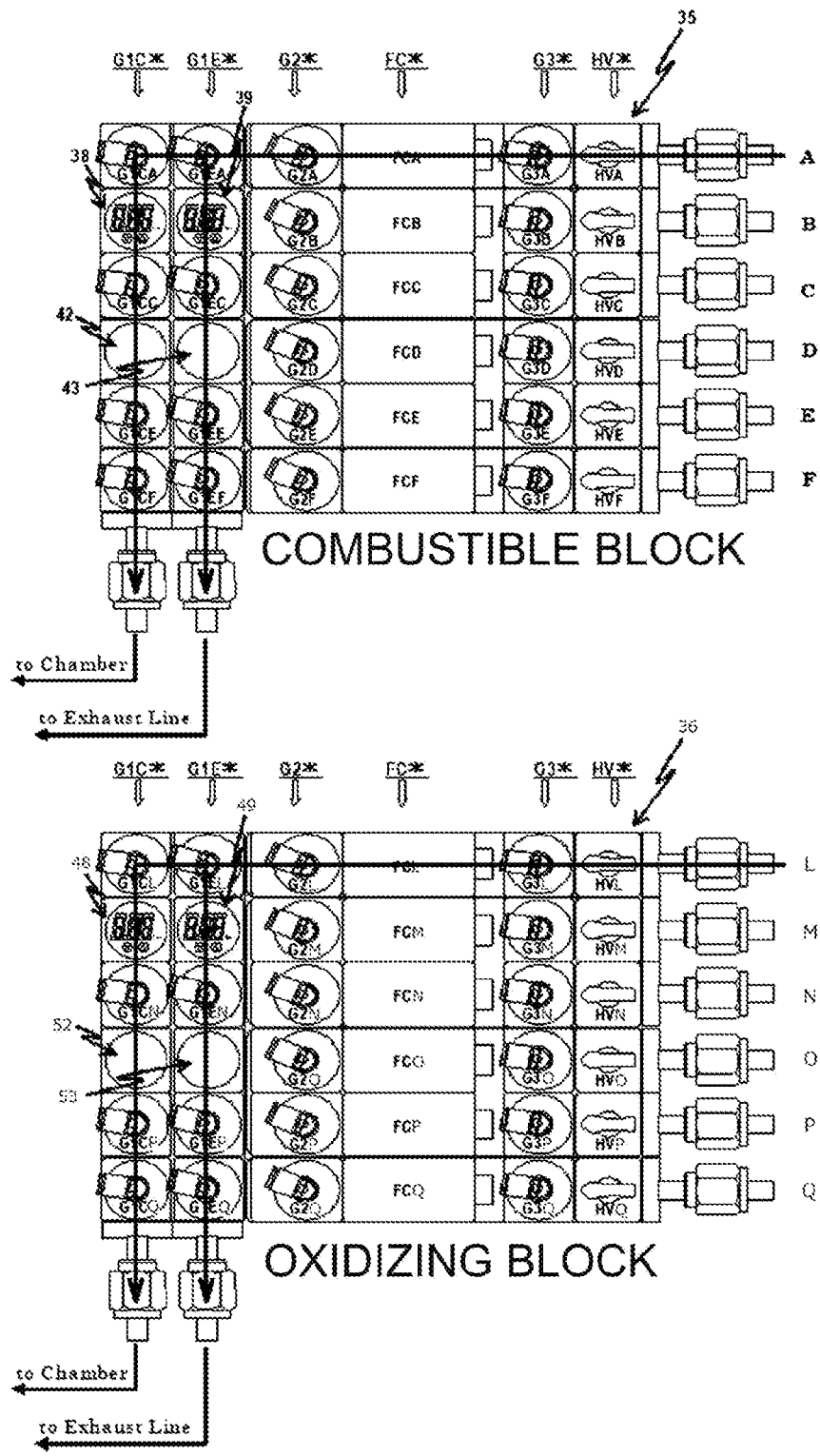
FIG. 12 is a diagram illustrating the flow of gas in the block of combustible gas and the block of oxidizing gas.

With the above control, as illustrated in FIG. 12, the purge gas A (Ar) and the purge gas L (Ar) are supplied to the chamber 3 through the chamber line to be able to perform purging and to purge the process gas E ($CH_4$) and the process gas P ($Cl_2$) remaining in the exhaust line. In the meantime, temperature control etc. may be performed on the wafer that is the workpiece 1.

If all the processes on the wafer that is the workpiece 1 are terminated, the gas flow control for unloading in Step S101 is performed. This state is as described above as with FIG. 6.

Second Embodiment

Figure 13:
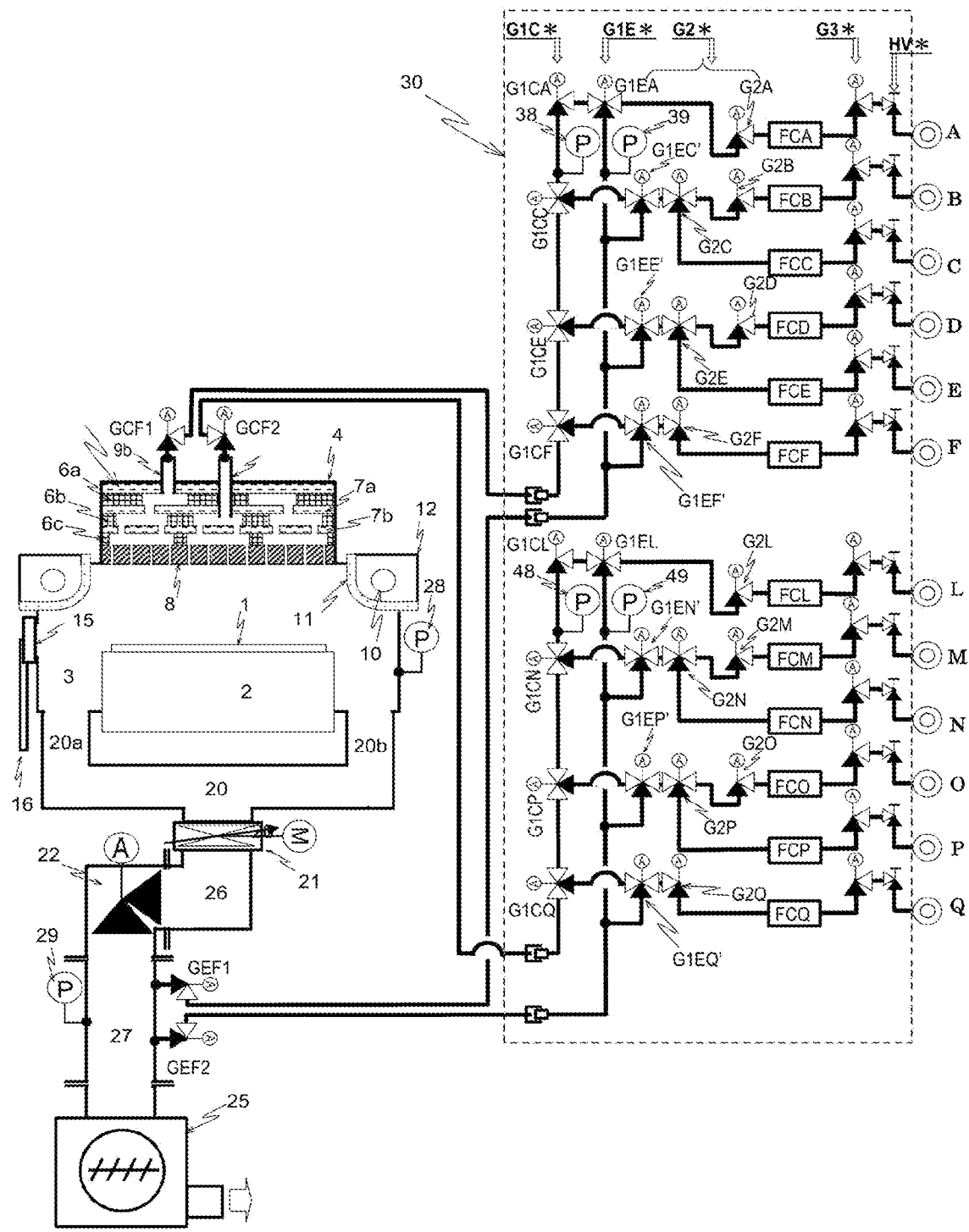
FIG. 13 is an example of the same diagram as FIG. 1 illustrating another embodiment.

Another embodiment will be described with reference to FIG. 13. A different point between the present embodiment and the embodiment illustrated in FIG. 1 is an installation mode of valves. Specifically, in valves G1EC', G1EE', G1EF', G1EN', G1EP', and G1EQ' that are special three-way valves to flow process gas to an exhaust line, the anti-diaphragm side is connected to a collective pipe of the exhaust line.

In these valves, the process gases are guided to the diaphragm side, and are sent out from there to the anti-diaphragm side of the G1C* valve. When these valves are driven and opened, the process gases are guided to the anti-diaphragm side, and are joined in the collective pipe of the waste gas exhaust line formed in the base 35. Therefore, as is clear from FIG. 13 that is a schematic diagram, the collective pipe has a dead space due to a branch pipe. When a dead space in the collective pipe for waste gas is acceptable, the configuration of FIG. 13 may be employed.

DESCRIPTION OF REFERENCE NUMERALS

1: workpiece
2: stage
3: chamber
4: gas dispersion room
5: top plate
6a, 6b, 6c: spacer
7a, 7b: gas dispersion plate
8: shower plate
9a, 9b: nozzle
10: halogen lamp
11: transmission window
15: gate valve
16: gate valve drive shaft
20a, 20b: exhaust port
20: exhaust pipe
21: pressure control valve
22: main valve
25: dry pump 26: connection pipe
27: exhaust pipe
28: pressure gauge (for chamber line)
29: pressure gauge (for exhaust line)
30: gas box
35: base
38: pressure gauge (combustible/chamber line collective pipe)
39: pressure gauge (combustible/exhaust line collective pipe)
48: pressure gauge (oxidizing/chamber line collective pipe)
49: pressure gauge (oxidizing/exhaust line collective pipe)
42: free port
43: free port

The invention claimed is:

1. A gas supply apparatus that supplies gas to a processing chamber in which a sample is processed, the gas supply apparatus comprising:
    ports respectively connected to gas sources of a plurality of types of gases containing a purging gas and a processing gas; and
    a collective pipe in which the plurality of types of gases supplied from the ports are joined and flowed, wherein
    a gas flow path through which gas supplied from the port connected to the gas source for the purging gas flows is formed on an uppermost stream side of the collective pipe,
    wherein an uppermost stream gas valve that flows out the purging gas is arranged in a direction flowing out a flow-controlled purge gas from a diaphragm side to an anti-diaphragm side by an opening operation of a diaphragm, and a gas contact portion when the processing gas flows out to the collective pipe is limited to a central pressing part of the diaphragm and an uppermost stream end of the collective pipe does not have a dead volume.

2. The gas supply apparatus according to claim 1, wherein
    a three-way valve configured to perform opening and closing operations by a diaphragm is arranged on the collective pipe,
    the three-way valve forms the collective pipe itself in a diaphragm-side gas flow path through which gas can pass without cutting off a gas flow, and
    the processing gas to be flowed out by an opening operation of the diaphragm of the three-way valve is configured to be joined in the collective pipe.

3. A gas supply apparatus that supplies gas to a processing chamber in which a sample is processed, the gas supply apparatus comprising:
    ports respectively connected to gas sources of a plurality of types of gases containing a purging gas and a processing gas; and
    a collective pipe in which the plurality of types of gases supplied from the ports are joined and flowed, wherein
    a gas flow path through which gas supplied from the port connected to the gas source for the purging gas flows is formed on an uppermost stream side of the collective pipe,
    wherein
    the gas supply apparatus further comprises separately a three-way valve configured to perform opening and closing operations by a diaphragm, a flow rate controller for the processing gas, and a flow rate controller for a dilution gas diluting the processing gas, and
    to control a flow rate of the processing gas, a gas flow path through which the dilution gas can pass without cutting off a gas flow is formed on a diaphragm side of the three-way valve and the processing gas is flowed out by an opening operation of the diaphragm of the three-way valve to be joined into the gas flow path through which the dilution gas can pass.

4. The gas supply apparatus according to claim 3, wherein a gas valve downstream of the flow rate controller flowing out the dilution gas is arranged in a direction flowing out a flow-controlled dilution gas from a diaphragm side to an anti-diaphragm side, and a gas contact portion of the process gas joined into the gas flow path is limited to a central pressing part of the diaphragm and an uppermost stream end of the gas flow path does not have a dead volume.

5. The gas supply apparatus according to claim 3, wherein the collective pipe is separately provided with a first gas line configured to supply the purging gas and the processing gas to the processing chamber and a second gas line configured to exhaust the purging gas and the processing gas.

6. The gas supply apparatus according to claim 3, wherein gas supply blocks are formed for respective types of gases that cannot be mixed inside the common collective pipe and inside a common supply pipe configured to supply gas, and the collective pipe is provided for each of the gas supply blocks.

7. The gas supply apparatus according to claim 1, wherein the collective pipe is separately provided with a first gas line configured to supply the purging gas and the processing gas to the processing chamber and a second gas line configured to exhaust the purging gas and the processing gas.

8. The gas supply apparatus according to claim 1, wherein gas supply blocks are formed for respective types of gases that cannot be mixed inside the common collective pipe and inside a common supply pipe configured to supply gas, and the collective pipe is provided for each of the gas supply blocks.

* * * * *